(12) United States Patent
Albert et al.

(10) Patent No.: US 7,382,363 B2
(45) Date of Patent: Jun. 3, 2008

(54) MICROENCAPSULATED ELECTROPHORETIC DISPLAY WITH INTEGRATED DRIVER

(75) Inventors: Jonathan D. Albert, Philadelphia, PA (US); Holly G. Gates, Somerville, MA (US)

(73) Assignee: E Ink Corporation, Cambridge, MA (US)

( * ) Notice: Subject to any disclaimer, the term of this patent is extended or adjusted under 35 U.S.C. 154(b) by 368 days.

(21) Appl. No.: 10/906,118

(22) Filed: Feb. 3, 2005

(65) Prior Publication Data
US 2005/0134554 A1 Jun. 23, 2005

Related U.S. Application Data

(62) Division of application No. 09/917,325, filed on Jul. 27, 2001, now Pat. No. 6,967,640.

(51) Int. Cl.
G09G 5/00 (2006.01)
H01L 21/00 (2006.01)
H01L 21/82 (2006.01)

(52) U.S. Cl. ............ 345/204; 345/107; 359/296; 438/6; 438/29; 438/128; 438/453

(58) Field of Classification Search ............... 345/105, 345/107, 204; 359/296; 438/25, 26, 29, 438/46, 59, 110–118, 129, 453, 128
See application file for complete search history.

(56) References Cited

U.S. PATENT DOCUMENTS 3,036,388 A 5/1962 Tate

| | | |
|---|---|---|
| 3,384,488 A | 5/1968 | Tulagin et al. |
| 3,612,758 A | 10/1971 | Evans et al. |
| 3,668,106 A | 6/1972 | Ota |
| 3,670,323 A | 6/1972 | Sobel et al. |
| 3,756,693 A | 9/1973 | Ota |
| 3,767,392 A | 10/1973 | Ota |
| 3,792,308 A | 2/1974 | Ota |

(Continued)

FOREIGN PATENT DOCUMENTS

DE 44 31 441 C1 2/1996

(Continued)

OTHER PUBLICATIONS

Amundson, K., et al., "Flexible, Active-Matrix Display Constructed Using a Microencapsulated Electrophoretic Material and an Organic-Semiconductor-Based Backplane", SID 01 Digest, 160 (Jun. 2001).

(Continued)

*Primary Examiner*—Henry N Tran
(74) *Attorney, Agent, or Firm*—David J. Cole

(57) ABSTRACT

A mounted display assembly comprises a flexible substrate that supports both display elements and control circuits. The display assembly generally comprises: an electrical connection formed on the flexible substrate, the electrical connection having first and second contact pads; a display element in electrical communication with the first contact pad; and a control circuit mounted on the flexible substrate and in electrical communication with the second contact pad. In a preferred embodiment, the display element comprises a microencapsulated electrophoretic display medium. In another preferred embodiment, printing processes are employed in manufacturing methods for the display assembly.

18 Claims, 8 Drawing Sheets

U.S. PATENT DOCUMENTS

| | | |
|---|---|---|
| 3,806,893 A | 4/1974 | Ohnishi et al. |
| 3,850,627 A | 11/1974 | Wells et al. |
| 3,870,517 A | 3/1975 | Ota et al. |
| 3,892,568 A | 7/1975 | Ota |
| 3,972,040 A | 7/1976 | Hilsum et al. |
| 4,041,481 A | 8/1977 | Sato |
| 4,045,327 A | 8/1977 | Noma et al. |
| 4,068,927 A | 1/1978 | White |
| 4,071,430 A | 1/1978 | Liebert |
| 4,088,395 A | 5/1978 | Giglia |
| 4,123,346 A | 10/1978 | Ploix |
| 4,149,149 A | 4/1979 | Miki et al. |
| 4,203,106 A | 5/1980 | Dalisa et al. |
| 4,218,302 A | 8/1980 | Dalisa et al. |
| 4,261,653 A | 4/1981 | Goodrich |
| 4,305,807 A | 12/1981 | Somlyody |
| 4,311,361 A | 1/1982 | Somlyody |
| 4,324,456 A | 4/1982 | Dalisa |
| 4,390,403 A | 6/1983 | Batchelder |
| 4,418,346 A | 11/1983 | Batchelder |
| 4,430,648 A | 2/1984 | Togashi et al. |
| 4,439,507 A | 3/1984 | Pan et al. |
| 4,450,440 A | 5/1984 | White |
| 4,502,934 A | 3/1985 | Gazard et al. |
| 4,522,472 A | 6/1985 | Liebert et al. |
| 4,543,306 A | 9/1985 | Dubois et al. |
| 4,598,960 A | 7/1986 | DiSanto et al. |
| 4,643,528 A | 2/1987 | Bell, Jr. |
| 4,648,956 A | 3/1987 | Marshall et al. |
| 4,655,897 A | 4/1987 | DiSanto et al. |
| 4,686,524 A | 8/1987 | White |
| 4,732,830 A | 3/1988 | DiSanto et al. |
| 4,741,604 A | 5/1988 | Kornfeld |
| 4,742,345 A | 5/1988 | DiSanto et al. |
| 4,746,917 A | 5/1988 | DiSanto et al. |
| 4,776,675 A | 10/1988 | Takaochi et al. |
| 4,833,464 A | 5/1989 | DiSanto et al. |
| 4,846,931 A | 7/1989 | Gmitter et al. |
| 4,850,919 A | 7/1989 | DiSanto et al. |
| 4,883,561 A | 11/1989 | Gmitter et al. |
| 4,892,607 A | 1/1990 | DiSanto et al. |
| 4,931,019 A | 6/1990 | Park |
| 4,947,157 A | 8/1990 | DiSanto et al. |
| 4,947,159 A | 8/1990 | DiSanto et al. |
| 5,008,590 A | 4/1991 | Huisman et al. |
| 5,009,490 A | 4/1991 | Kuono et al. |
| 5,028,841 A | 7/1991 | DiSanto et al. |
| 5,041,824 A | 8/1991 | DiSanto et al. |
| 5,053,763 A | 10/1991 | DiSanto et al. |
| 5,066,105 A | 11/1991 | Yoshimoto et al. |
| 5,066,946 A | 11/1991 | DiSanto et al. |
| 5,070,326 A | 12/1991 | Yoshimoto et al. |
| 5,077,157 A | 12/1991 | DiSanto et al. |
| 5,105,185 A | 4/1992 | Nakanowatari et al. |
| 5,119,218 A | 6/1992 | Yoshimoto et al. |
| 5,128,226 A | 7/1992 | Hung |
| 5,128,785 A | 7/1992 | Yoshimoto et al. |
| 5,161,007 A | 11/1992 | Takanashi et al. |
| 5,174,882 A | 12/1992 | DiSanto et al. |
| 5,177,476 A | 1/1993 | DiSanto et al. |
| 5,187,609 A | 2/1993 | DiSanto et al. |
| 5,194,852 A | 3/1993 | More et al. |
| 5,206,749 A | 4/1993 | Zavracky |
| 5,216,416 A | 6/1993 | DiSanto et al. |
| 5,220,316 A | 6/1993 | Kazan |
| 5,223,115 A | 6/1993 | DiSanto et al. |
| 5,223,823 A | 6/1993 | DiSanto et al. |
| 5,234,541 A | 8/1993 | Shannon et al. |
| 5,238,861 A | 8/1993 | Morin et al. |
| 5,247,290 A | 9/1993 | DiSanto et al. |
| 5,250,932 A | 10/1993 | Yoshimoto et al. |
| 5,250,938 A | 10/1993 | DiSanto et al. |
| 5,254,981 A | 10/1993 | DiSanto et al. |
| 5,266,937 A | 11/1993 | DiSanto et al. |
| 5,270,843 A | 12/1993 | Wang |
| 5,276,438 A | 1/1994 | DiSanto et al. |
| 5,279,694 A | 1/1994 | DiSanto et al. |
| 5,293,528 A | 3/1994 | DiSanto et al. |
| 5,296,974 A | 3/1994 | Tada et al. |
| 5,302,235 A | 4/1994 | DiSanto et al. |
| 5,303,073 A | 4/1994 | Shirota et al. |
| 5,304,439 A | 4/1994 | DiSanto et al. |
| 5,315,312 A | 5/1994 | DiSanto et al. |
| 5,345,251 A | 9/1994 | DiSanto et al. |
| 5,359,346 A | 10/1994 | DiSanto et al. |
| 5,362,671 A | 11/1994 | Zavracky |
| 5,383,008 A | 1/1995 | Sheridon |
| 5,389,945 A | 2/1995 | Sheridon |
| 5,402,145 A | 3/1995 | DiSanto et al. |
| 5,403,772 A | 4/1995 | Zhang et al. |
| 5,411,656 A | 5/1995 | Schubert |
| 5,412,398 A | 5/1995 | DiSanto et al. |
| 5,447,810 A | 9/1995 | Chen et al. |
| 5,460,688 A | 10/1995 | DiSanto et al. |
| 5,463,492 A | 10/1995 | Check, III |
| 5,467,107 A | 11/1995 | DiSanto et al. |
| 5,492,863 A | 2/1996 | Higgins, III |
| 5,499,038 A | 3/1996 | DiSanto et al. |
| 5,508,720 A | 4/1996 | DiSanto et al. |
| 5,543,589 A | 8/1996 | Buchana et al. |
| 5,545,291 A | 8/1996 | Smith et al. |
| 5,561,443 A | 10/1996 | DiSanto et al. |
| 5,565,885 A | 10/1996 | Tamanoi |
| 5,569,610 A | 10/1996 | Zhang et al. |
| 5,573,711 A | 11/1996 | Hou et al. |
| 5,575,554 A | 11/1996 | Guritz |
| 5,583,675 A | 12/1996 | Yamada et al. |
| 5,602,572 A | 2/1997 | Rylander |
| 5,609,978 A | 3/1997 | Giorgianni et al. |
| 5,614,340 A | 3/1997 | Bugner et al. |
| 5,623,585 A | 4/1997 | Matias et al. |
| 5,625,199 A | 4/1997 | Baumbach et al. |
| 5,627,561 A | 5/1997 | Laspina et al. |
| 5,638,103 A | 6/1997 | Obata et al. |
| 5,648,801 A | 7/1997 | Beardsley et al. |
| 5,650,199 A | 7/1997 | Chang et al. |
| 5,650,247 A | 7/1997 | Taniguchi et al. |
| 5,650,872 A | 7/1997 | Saxe et al. |
| 5,660,570 A | 8/1997 | Chan et al. |
| 5,675,719 A | 10/1997 | Matias et al. |
| 5,684,501 A | 11/1997 | Knapp et al. |
| 5,686,383 A | 11/1997 | Long et al. |
| 5,688,584 A | 11/1997 | Casson et al. |
| 5,689,282 A | 11/1997 | Wolfs et al. |
| 5,699,102 A | 12/1997 | Ng et al. |
| 5,707,738 A | 1/1998 | Hou |
| 5,714,051 A | 2/1998 | Van Leth et al. |
| 5,715,511 A | 2/1998 | Aslam et al. |
| 5,715,514 A | 2/1998 | Williams et al. |
| 5,717,514 A | 2/1998 | Sheridon |
| 5,718,996 A | 2/1998 | Iijima et al. |
| 5,721,042 A | 2/1998 | Iijima et al. |
| 5,725,935 A | 3/1998 | Rajan |
| 5,729,663 A | 3/1998 | Lin et al. |
| 5,731,116 A | 3/1998 | Matsuo et al. |
| 5,737,115 A | 4/1998 | Mackinlay et al. |
| 5,738,977 A | 4/1998 | Van Der Sluis-Van Der Voort et al. |
| 5,739,801 A | 4/1998 | Sheridon |
| 5,740,495 A | 4/1998 | Maher et al. |
| 5,744,283 A | 4/1998 | Spierings et al. |
| 5,745,094 A | 4/1998 | Gordon, II et al. |
| 5,750,238 A | 5/1998 | Iijima et al. |
| 5,760,761 A | 6/1998 | Sheridon |

| Patent | Date | Inventor |
|---|---|---|
| 5,777,782 A | 7/1998 | Sheridon |
| 5,783,856 A | 7/1998 | Smith et al. |
| 5,786,875 A | 7/1998 | Brader et al. |
| 5,808,783 A | 9/1998 | Crowley |
| 5,821,137 A | 10/1998 | Wakai et al. |
| 5,824,186 A | 10/1998 | Smith et al. |
| 5,872,552 A | 2/1999 | Gordon, II et al. |
| 5,892,244 A | 4/1999 | Tanaka et al. |
| 5,892,504 A | 4/1999 | Knapp |
| 5,898,416 A | 4/1999 | Kuijk et al. |
| 5,904,545 A | 5/1999 | Smith et al. |
| 5,930,026 A | 7/1999 | Jacobson et al. |
| 5,936,259 A | 8/1999 | Katz et al. |
| 5,961,804 A | 10/1999 | Jacobson et al. |
| 5,969,376 A | 10/1999 | Bao |
| 5,972,493 A | 10/1999 | Iwasaki et al. |
| 5,980,763 A | 11/1999 | Young |
| 6,005,791 A | 12/1999 | Gudesen et al. |
| 6,005,817 A | 12/1999 | Gudesen et al. |
| 6,017,584 A | 1/2000 | Albert et al. |
| 6,045,955 A | 4/2000 | Vincent |
| 6,052,354 A | 4/2000 | Gudesen et al. |
| 6,054,071 A | 4/2000 | Mikkelsen, Jr. |
| 6,055,091 A | 4/2000 | Sheridon et al. |
| 6,055,180 A | 4/2000 | Gudesen et al. |
| 6,067,185 A | 5/2000 | Albert et al. |
| 6,084,850 A | 7/2000 | Gudesen et al. |
| 6,087,519 A | 7/2000 | Garnier et al. |
| 6,088,319 A | 7/2000 | Gudesen |
| 6,091,382 A | 7/2000 | Shioya et al. |
| 6,097,531 A | 8/2000 | Sheridon |
| 6,118,426 A | 9/2000 | Albert et al. |
| 6,120,588 A | 9/2000 | Jacobson |
| 6,120,839 A | 9/2000 | Comiskey et al. |
| 6,124,851 A | 9/2000 | Jacobson |
| 6,128,124 A | 10/2000 | Silverman |
| 6,130,773 A | 10/2000 | Jacobson et al. |
| 6,130,774 A | 10/2000 | Albert et al. |
| 6,137,467 A | 10/2000 | Sheridon et al. |
| 6,140,980 A | 10/2000 | Spitzer et al. |
| 6,144,361 A | 11/2000 | Gordon, II et al. |
| 6,147,791 A | 11/2000 | Sheridon |
| 6,172,798 B1 | 1/2001 | Albert et al. |
| 6,177,921 B1 | 1/2001 | Comiskey et al. |
| 6,184,856 B1 | 2/2001 | Gordon, II et al. |
| 6,219,160 B1 | 4/2001 | Nordal et al. |
| 6,225,971 B1 | 5/2001 | Gordon, II et al. |
| 6,232,950 B1 | 5/2001 | Albert et al. |
| 6,239,896 B1 | 5/2001 | Ikeda |
| 6,241,921 B1 | 6/2001 | Jacobson et al. |
| 6,249,271 B1 | 6/2001 | Albert et al. |
| 6,252,564 B1 | 6/2001 | Albert et al. |
| 6,262,706 B1 | 7/2001 | Albert et al. |
| 6,262,833 B1 | 7/2001 | Loxley et al. |
| 6,271,823 B1 | 8/2001 | Gordon, II et al. |
| 6,300,932 B1 | 10/2001 | Albert |
| 6,301,038 B1 | 10/2001 | Fitzmaurice et al. |
| 6,312,304 B1 | 11/2001 | Duthaler et al. |
| 6,312,971 B1 | 11/2001 | Amundson et al. |
| 6,323,989 B1 | 11/2001 | Jacobson et al. |
| 6,327,072 B1 | 12/2001 | Comiskey et al. |
| 6,343,164 B1 | 1/2002 | Robertsson et al. |
| 6,359,605 B1 | 3/2002 | Knapp et al. |
| 6,369,793 B1 | 4/2002 | Parker |
| 6,370,019 B1 | 4/2002 | Matthies et al. |
| 6,373,454 B1 | 4/2002 | Knapp et al. |
| 6,376,828 B1 | 4/2002 | Comiskey |
| 6,377,387 B1 | 4/2002 | Duthaler et al. |
| 6,392,785 B1 | 5/2002 | Albert et al. |
| 6,392,786 B1 | 5/2002 | Albert |
| 6,413,790 B1 | 7/2002 | Duthaler et al. |
| 6,422,687 B1 | 7/2002 | Jacobson |
| 6,432,739 B1 | 8/2002 | Gudesen et al. |
| 6,445,374 B2 | 9/2002 | Albert et al. |
| 6,445,489 B1 | 9/2002 | Jacobson et al. |
| 6,459,418 B1 | 10/2002 | Comiskey et al. |
| 6,468,638 B2 * | 10/2002 | Jacobsen et al. ............ 428/209 |
| 6,473,072 B1 | 10/2002 | Comiskey et al. |
| 6,480,182 B2 | 11/2002 | Turner et al. |
| 6,498,114 B1 | 12/2002 | Amundson et al. |
| 6,504,524 B1 | 1/2003 | Gates et al. |
| 6,506,438 B2 | 1/2003 | Duthaler et al. |
| 6,512,354 B2 | 1/2003 | Jacobson et al. |
| 6,515,649 B1 | 2/2003 | Albert et al. |
| 6,518,949 B2 | 2/2003 | Drzaic |
| 6,527,964 B1 * | 3/2003 | Smith et al. .................. 216/19 |
| 6,531,997 B1 | 3/2003 | Gates et al. |
| 6,535,197 B1 | 3/2003 | Comiskey et al. |
| 6,545,291 B1 | 4/2003 | Amundson et al. |
| 6,573,880 B1 | 6/2003 | Simoni et al. |
| 6,606,247 B2 * | 8/2003 | Credelle et al. ............ 361/737 |
| 6,639,578 B1 | 10/2003 | Comiskey et al. |
| 6,661,563 B2 | 12/2003 | Hayahi et al. |
| 6,664,944 B1 | 12/2003 | Albert et al. |
| 6,672,921 B1 | 1/2004 | Liang et al. |
| 6,680,725 B1 | 1/2004 | Jacobson |
| 6,693,620 B1 | 2/2004 | Herb et al. |
| 6,710,540 B1 | 3/2004 | Albert et al. |
| 6,724,519 B1 | 4/2004 | Comiskey et al. |
| 6,727,881 B1 | 4/2004 | Albert et al. |
| 6,825,068 B2 | 11/2004 | Denis et al. |
| 6,825,829 B1 | 11/2004 | Albert et al. |
| 6,827,584 B2 * | 12/2004 | Mathieu et al. ............... 439/66 |
| 6,839,158 B2 | 1/2005 | Albert et al. |
| 6,842,657 B1 | 1/2005 | Drzaic et al. |
| 2002/0060321 A1 | 5/2002 | Kazlas et al. |
| 2002/0113770 A1 | 8/2002 | Jacobson et al. |
| 2003/0020844 A1 | 1/2003 | Albert et al. |
| 2004/0119681 A1 | 6/2004 | Albert et al. |
| 2005/0035941 A1 | 2/2005 | Albert et al. |

FOREIGN PATENT DOCUMENTS

| | | |
|---|---|---|
| DE | 195 00 694 | 8/1996 |
| EP | 0 404 545 A2 | 12/1990 |
| EP | 0 443 571 A2 | 8/1991 |
| EP | 0 618 715 A1 | 10/1994 |
| EP | 0 709 713 A2 | 5/1996 |
| EP | 0 924 551 A1 | 6/1999 |
| EP | 1 024 540 A2 | 8/2000 |
| FR | 2693005 | 12/1993 |
| GB | 1314906 | 4/1973 |
| GB | 2 149 548 A | 6/1985 |
| GB | 2 306 229 A | 4/1997 |
| JP | 54-111368 A | 8/1979 |
| JP | 55-096922 A | 7/1980 |
| JP | 62-058222 A | 3/1987 |
| JP | 62-231930 A | 10/1987 |
| JP | 64-86116 | 3/1989 |
| JP | 03-053114 A | 3/1991 |
| JP | 03-053224 A | 3/1991 |
| JP | 03-091722 A | 4/1991 |
| JP | 03-096925 A | 4/1991 |
| JP | 05-061421 A | 3/1993 |
| JP | 06-089081 A | 3/1994 |
| JP | 06-202168 A | 7/1994 |
| JP | 07-036020 A | 2/1995 |
| JP | 09-006277 A | 1/1997 |
| JP | 09-031453 A | 2/1997 |
| JP | 09-185087 A | 7/1997 |
| JP | 09-230391 A | 9/1997 |
| JP | 10-048673 A | 2/1998 |
| JP | 10-149118 A | 6/1998 |
| JP | 10-161161 A | 6/1998 |
| JP | 11-202804 A | 7/1999 |
| JP | 11-212499 A | 8/1999 |

| | | |
|---|---|---|
| JP | 11-219135 A | 8/1999 |
| JP | 11-264812 A | 9/1999 |
| JP | 2001-109407 | 4/2001 |
| WO | WO 92/15982 | 9/1992 |
| WO | WO 95/06307 | 3/1995 |
| WO | WO 95/10107 | 4/1995 |
| WO | WO 99/12170 | 3/1999 |
| WO | WO 99/20682 | 4/1999 |
| WO | WO 99/26419 | 5/1999 |
| WO | WO 99/40631 | 8/1999 |
| WO | WO 99/41732 | 8/1999 |
| WO | WO 99/41788 | 8/1999 |
| WO | WO 99/45582 | 9/1999 |
| WO | WO 99/63527 | 12/1999 |
| WO | WO 00/05704 | 2/2000 |
| WO | WO 00/36560 | 6/2000 |
| WO | WO 00/38000 | 6/2000 |
| WO | WO 00/67110 | 11/2000 |
| WO | WO 00/67327 | 11/2000 |
| WO | WO 01/07961 | 2/2001 |
| WO | WO 01/27690 | 4/2001 |

OTHER PUBLICATIONS

Antia, M., "Switchable Reflections Make Electronic Ink", Science, 285, 658 (1999).
Blazo, S.F., "High Resolution Electrophoretic Display with Photoconductor Addressing", SID Digest 1982, p. 152.
Bohnke et al., "Polymer-Based Solid Electrochromic Cell for Matrix-Addressable Display Devices." J. Electrochem. Soc., 138, 3612 (1991).
Chen, Y., et al., "A Conformable Electronic Ink Display using a Foil-Based a-Si TFT Array", SID 01 Digest, 157 (Jun. 2001).
Chiang, A., et al., "A High Speed Electrophoretic Matrix Display", SID 80 Digest (1980), 114.
Chiang, A., et al., "A Stylus Writable Electrophoretic Display Device", SID 79 Digest (1979), 44.
Comiskey, B., et al., "An electrophoretic ink for all-printed reflective electronic displays", Nature, 394, 253 (1998).
Comiskey, B., et al., "Electrophoretic Ink: A Printable Display Material", SID 97 Digest (1997), p. 75.
Dabbousi, B.O., et al., "Electroluminescence from CdSe quantum-dot/polymer composites", Appl. Phys. Lett., 66, 1316 (1995).
Dalisa, A.L., "Electrophoretic Display Technology", IEEE Trans. Electron Dev., ED-24, 827 (1977).
Drzaic, P., et al., "A Printed and Rollable Bistable Electronic Display", SID 98 Digest (1998), p. 1131.
Hopper, M.A., et al., "An Electrophoretic Display, Its Properties, Model and Addressing", IEEE Trans. Electron Dev., ED-26, 1148 (1979).
Hosaka, H., et al., "Electromagnetic microrelays: concepts and fundamental characteristics", Sensors and Actuators A, 40, 41 (1994).
Huang, J., et al., "Photoluminescence and electroluminescence of ZnS:Cu nanocrystals in polymeric networks", Appl. Phys. Lett., 70, 2335 (1997).
Jacobson, J., et al., "The last book", IBM Systems J., 36, 457 (1997).
Kazlas, P., et al., "12.1 SVGA Microencapsulated Electrophoretic Active Matrix Display for Information Appliances", SID 01 Digest, 152 (Jun. 2001).
Kitamura, T., et al., "Electrical toner movement for electronic paper-like display", Asia Display/IDW '01, p. 1517, Paper HCS1-1 (2001).
Kornfeld, A Defect-Tolerant Active-Matrix Electrophoretic Display, SID Digest, 1984, p. 142.
Moesner, F.M., et al., "Devices for Particle Handling by an AC Electric Field", IEEE, 1995, p. 66.
Murau, P., "Characteristics of an X-Y Addressed Electrophoretic Image Display (EPID)," SID 84 Digest (1984) p. 141.
Nakamura, E., et al., "Development of Electrophoretic Display Using Microcapsulated Suspension," SID 98 Digest (1998), p. 1014.
O'Regan, B. et al., "A Low Cost, High-efficiency Solar Cell Based on Dye-sensitized colloidal TiO2 Films", Nature, vol. 353, Oct. 24, 1991, 773-740.
Ota, I., et al., "Developments in Electrophoretic Displays", Proceedings of the SID, 18, 243 (1977).
Ota, I., et al., "Electrophoretic display devices", Laser 75 Optoelectronics Conference Proceedings, 145 (1975).
Ota, I., et al., "Electrophoretic Image Display (EPID) Panel", Proceedings of the IEEE, 61, 832 (1973).
Pankove, "Color Reflection Type Display Panel", RCA Technical Notes, Mar. 1962, No. 535.
Quon, W.S., "Multilevel Voltage Select (MLVS): A Novel Technique to X-Y Address an Electrophoretic Display", Correspondence, 1977, pp. 1120-1123.
Ridley, B.A. et al., "All-Inorganic Field Effect Transistors by Printing," Science, 286, 746 (1999).
Saitoh, M., et al., "A newly developed electrical twisting ball display", Proceedings of the SID, 23, 249 (1982).
Sheridon, N.K., et al., "A Photoconductor-Addressed Electrophoretic Cell for Office Data Display", SID 82 Digest, 94 (1982).
Shiffman, R.R., et al., "An Electrophoretic Image Display with Internal NMOS Address Logic and Display Drivers," Proceedings of the SID, 1984, vol. 25, 105 (1984).
Shiwa, S., et al., "Electrophoretic Display Method Using Ionographic Technology," SID 88 Digest (1988), p. 61.
Singer, B., et al., "An X-Y Addressable Electrophoretic Display," Proceedings of the SID, 18, 255 (1977).
Vance, D.W., "Optical Characteristics of Electrophoretic Displays", Proceedings of the SID, 18, 267 (1977).
Vaz, N.A., et al., "Dual-frequency addressing of polymer-dispersed liquid-crystal films", J. Appl. Phys., 65, 5043 (1989).
White, R., "An Electrophoretic Bar Graph Display," Proceedings of the SID, 22, 173 (1981).
Yamaguchi, M., et al., "Equivalent Circuit of Ion Projection-Driven Electrophoretic Display," IEICE Transactions, 74, 4152 (1991).
Yamaguchi, Y., et al., "Toner display using insulative particles charged triboelectrically", Asia Display/IDW '01, p. 1729, Paper AMD4-4 (2001).

* cited by examiner

600

STEP 610

```
FORM
ELECTRICAL CONNECTIONS
WITH CONTACT PADS
ON FLEXIBLE SUBSTRATE
```

STEP 620

```
PROVIDE
ELECTROPHORETIC
DISPLAY ELEMENTS
ON THE FLEXIBLE SUBSTRATE
```

STEP 630

```
BOND
CONTROL CIRCUITS
TO CONTACT PADS
```

FIG. 6

MICROENCAPSULATED ELECTROPHORETIC DISPLAY WITH INTEGRATED DRIVER

REFERENCE TO RELATED APPLICATION

This application is a division of application Ser. No. 09/917,325, filed Jul. 27, 2001 (now U.S. Pat. No. 6,967,640), the entire disclosure of which is herein incorporated by reference.

TECHNICAL FIELD

The invention relates generally to panel-type display devices and more particularly to flexible electrophoretic displays.

BACKGROUND OF THE INVENTION

Panel-type electronic display devices typically require a rigid circuit board mounted control circuit. For example, the liquid crystal displays found in laptop computers typically have several integrated circuits mounted on circuit boards, the circuit boards arranged around the liquid crystal portion of the panel. As panels of increasing size and resolution are developed, panels tend to require larger and heavier circuit boards in the manufacture of the display.

Such printed circuit boards are expensive to manufacture and present the additional cost and complexity of physical and electrical interfacing with other display components. The added manufacturing steps required to connect the electrical conductors on the display medium portion of a display, e.g. the liquid crystal portion, with the electrical conductors on a circuit board also lead to yield loss.

It would be desirable, for many applications, to have thin, flexible displays, though liquid crystal media are not well suited to use with flexible substrates. Combined use of flexible substrates and lower cost conductor printing methods holds the potential of lower cost displays for a variety of uses, such as: rolled displays; affordable large area displays; displays incorporated into fabrics; and as a paper substitute. Unfortunately, the cost of circuit boards and the mating of circuit boards to substrates are two impediments to realization of the advantages of flexible displays.

SUMMARY OF THE INVENTION

In a broad sense, the invention provides simpler, lower cost manufacturing methods and realization of the advantages of flexible displays through better use of flexible substrates. In one aspect, the invention provides a lower-cost, more flexible, and more useful display device through an electrophoretic display assembly and method of manufacturing the electrophoretic display assembly. In one embodiment, the display assembly comprises: a flexible substrate; an electrical connection formed on the flexible substrate; the electrical connection having first and second contact pads; an electrophoretic display element in electrical communication with the first contact pad; and a control circuit mounted on the flexible substrate and in electrical communication with the second contact pad.

A method of manufacturing the electrophoretic display assembly, in one embodiment, comprises: formation of electrical connections, including contact pads, on a flexible substrate; mounting a control circuit on the flexible substrate by bonding control circuit leads to the contact pads; and forming one or more electrophoretic display elements on the flexible substrate, where the control circuit drives the display elements.

In the case of prior art display assemblies with display elements on rigid or flexible substrates, control circuitry is typically mounted on rigid circuit boards. The substrate portion of the display assembly and the control circuitry portions must then be physically joined. This approach has cost and reliability disadvantages.

In contrast, the present invention, in one aspect, provides co-location of display elements and control circuitry on a shared, flexible substrate. This permits manufacturing of a flexible panel display. In one embodiment, use of an electrophoretic display medium, in particular an encapsulated electrophoretic display medium, leads to a flexible display that can be substantially flexed without substantial detrimental impact on the optical performance of the display medium.

Use of an encapsulated electrophoretic display medium further permits use of lower cost printing methods for deposition of the display medium. In a preferred embodiment, the display assembly provides for printing of electrical connections between display elements and control circuitry in a single printing step.

In one aspect, the invention eliminates the manufacturing steps that would be entailed in electrically and physically joining separate display medium substrate and control circuit substrate portions of a display. In the preferred embodiment of a common flexible substrate shared by the display medium and the control circuit, joining steps are eliminated, cost and yield are improved, and an overall more flexible structure is obtained.

The invention permits advantageous use of an electrophoretic display medium. An electrophoretic display has attributes of good brightness and contrast, wide viewing angles, state bistability, and low power consumption when compared with liquid crystal displays. In particular, use of an encapsulated (or "microencapsulated") electrophoretic display medium provides advantages, such as the ability to print or coat the display medium on a wide variety of flexible or rigid substrates. Further, because the display medium can be printed (using a variety of methods), the display itself can be made less expensively.

A microencapsulated electrophoretic display medium is well suited to flexible display applications, since it can tolerate a high degree of flexing without substantial detrimental impact on its optical performance.

BRIEF DESCRIPTION OF THE DRAWINGS

The invention, in accordance with preferred and exemplary embodiments, together with further advantages thereof, is more particularly described in the following detailed description, taken in conjunction with the accompanying drawings.

In the drawings, like reference characters generally refer to the same parts throughout the different views. Also, the drawings are not necessarily to scale, emphasis instead generally being placed upon illustrating principles of the invention.

FIG. 6 shows a flow chart of an embodiment of a manufacturing process for a flexible display assembly.

DETAILED DESCRIPTION OF THE INVENTION

In broad overview, the invention entails support of an electrophoretic display medium, control circuits, and electrical conductors on a common flexible substrate. This leads to manufacturing with lower cost of processing steps, and higher product yield. The resulting flexible display assembly has many advantageous uses, for example, in production of large area displays or display devices that can be flexed or rolled.

I. An Electrophoretic Display Assembly

Figure 1:
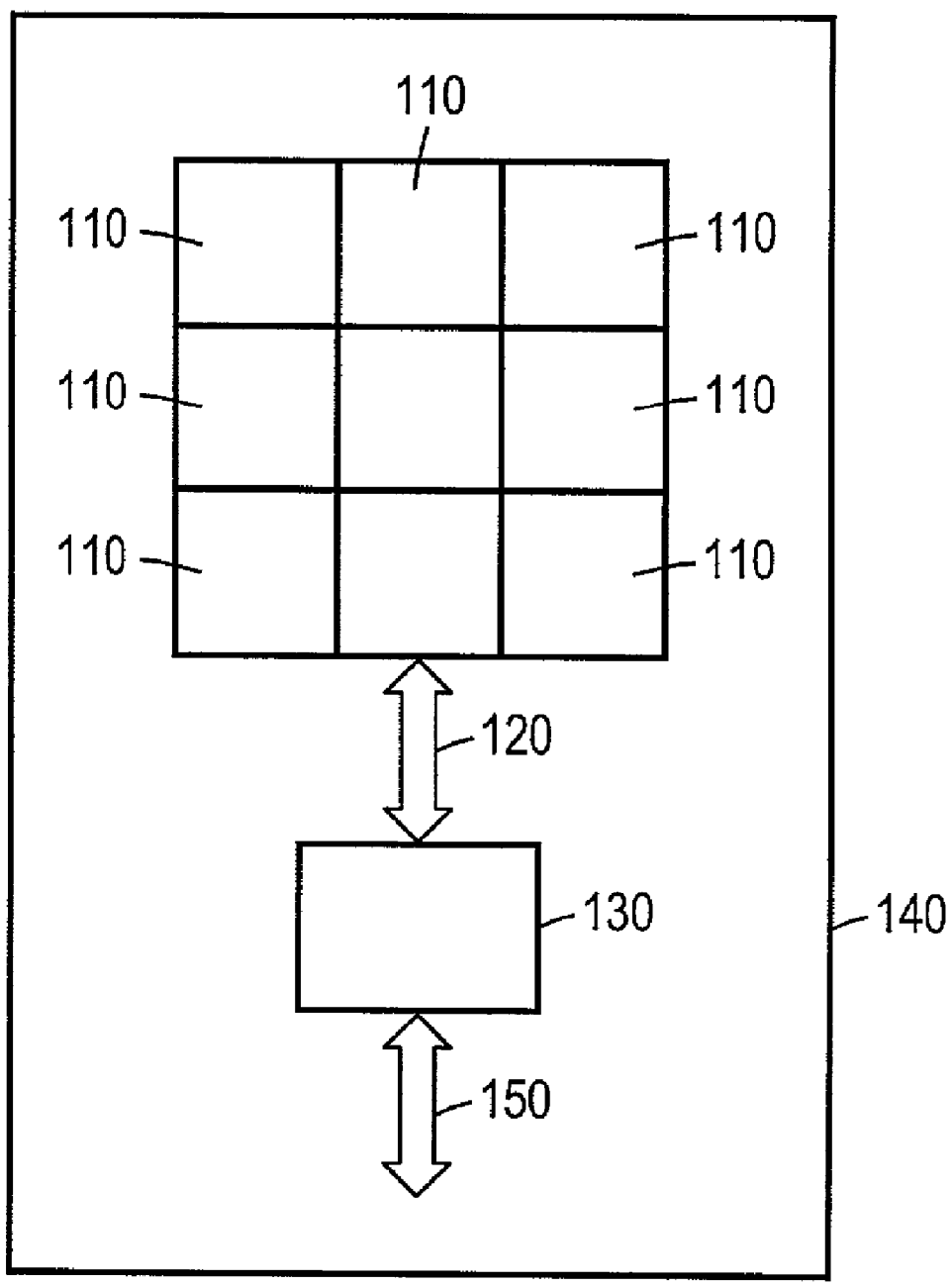
FIG. 1 shows a diagrammatic planar view of an embodiment of a display assembly.

FIG. 1, in broad overview, depicts a schematic representation of an embodiment of an electrophoretic display assembly 100. The display assembly 100 comprises: electrophoretic display elements 110, each element 110 corresponding to a single pixel of the display assembly 100; a control circuit 130, the control circuit 130 in electrical communication with the display elements 110 via drive signal electrical connections 120, and in electrical communication with other components (not shown) either present on or off of a flexible substrate 140 via other electrical connections 150, where the display elements 110, the control circuit 130, and the drive signal electrical connections 120 are supported by the flexible substrate 140. The terms "control circuit" and "control circuitry" are here used interchangeably and can comprise single or multiple components.

For simplicity, nine display elements 110 are shown in FIG. 1. Generally, however, the display assembly 100 would include a larger number of display elements 110. Further, a variety of shapes can be employed for the display elements 110 to provide, for example, a more pleasing appearance in alphanumeric data presented by the display assembly 100.

The control circuit 130 is generally comprised of one or more integrated circuits (the terms "IC" or "chip" are here used interchangeably with "integrated circuit"), such as driver chips, interface chips and other control chips. In one embodiment, the control circuit 130 comprises one or more driver chips, the driver chips supplying drive voltages to the display elements 110. In an alternative of this embodiment, interface chips, either supported on or off the flexible substrate 140 can mediate electrical communication between one or more driver chips mounted on the flexible substrate 140 and other IC's mounted either on or off the flexible substrate 140.

Figure 2A:
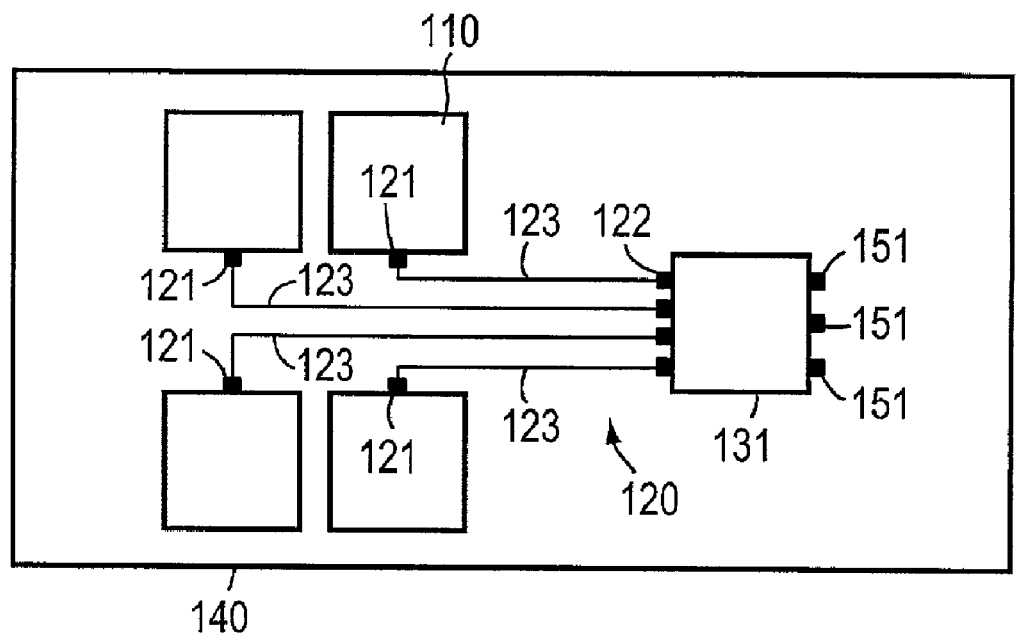
FIG. 2A shows a planar view of an alternative embodiment of the display assembly of FIG. 1.

In further detail, referring to FIG. 2A, an embodiment of a display assembly 140 with four display elements 110 in electrical communication with a single driver chip 131 is shown. The drive signal electrical connections 120 comprise four individual electrical connections 123, one for each of the four display elements 110 depicted in FIG. 2.

The individual electrical connections 123 are lines of conductive material, the conductive material being deposited via a number of possible processes. In a preferred embodiment, the conductive material is deposited by printing methods, employing, for example, electrically conductive ink. This provides for relatively low cost processing. Further, electrical connections 123 can be formed in a single step, further reducing processing cost and enhancing manufacturing yield.

The display 100 can employ various materials. The flexible substrate 140 can comprise a polyester sheet with electrical connections 123 formed of copper by conventional patterning techniques. Alternatively, the electrical connections 123 can be printed with silver ink or carbon ink. The electrical connections can be coated by printing with a dielectric, for example a polymer. Vias through the dielectric can provide for electrical contact to a display element 110. Each electrical connection 123 is in communication with a first contact pad 121 and a second contact pad 122. Further, each first contact pad 121 is in electrical communication with one of the display elements 110 while each of the second contact pads 122 is in electrical communication with the driver chip 131. The driver chip 131 is in electrical communication with other contact pads 151 to provide for electrical communication with other IC's (not shown) of the control circuit 130.

Figure 2B:
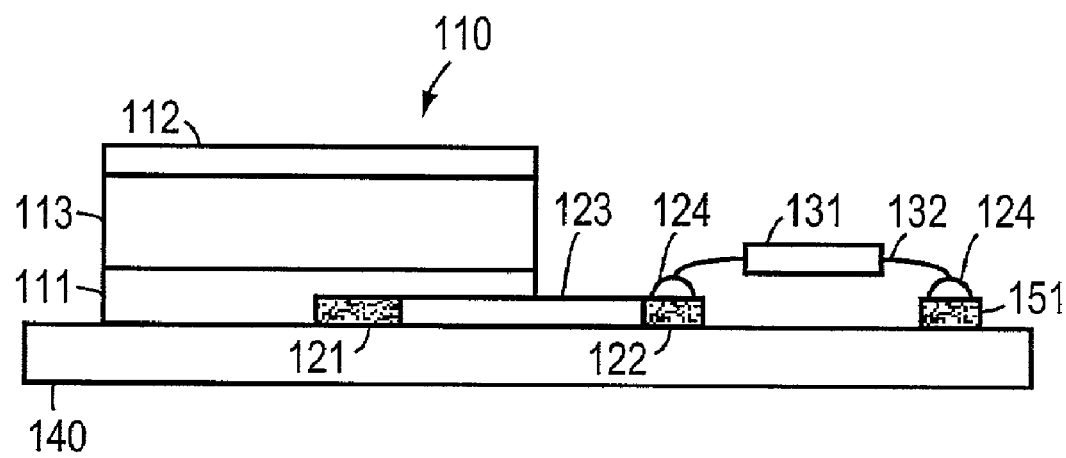
FIG. 2B shows a cross-sectional view that generally corresponds to the display of FIG. 2A.

Referring to FIG. 2B, a cross-section view corresponding in general principles to the embodiment of FIG. 2A is shown. In this embodiment, the display element 110 is comprised of: a pixel electrode 111, an electrophoretic display medium 113; and a second electrode 112. In this embodiment, each display element 110 has its own pixel electrode 111 while the second electrode 112 can be shared by more than one display element 110. That is, a common second electrode 112 can extend across multiple display elements 110, and preferably extends across all the display elements 110.

The first contact pad 121 can contact the pixel electrode 111 along the side of the pixel electrode 111, as indicated in FIG. 2A. Alternatively, the first contact pad 121 can contact the pixel electrode 111 at any location on a surface of the pixel electrode 111, though preferably on a surface opposite to the display medium 113.

In the embodiment of FIG. 2B, the driver chip 131 makes electrical contact with the second contact pads 122 and other contact pads 151 through leads 132 and a bonding material 124. The bonding material comprises any material that is suitable for physically securing electrical communication between a lead 132 and a contact pad 124, for example an anisotropic conductive film (ACF), a conductive epoxy (such as silver-filled epoxy), an electrically conductive thermoset, silver paint, an electrically conductive ink, or an electrically conductive paint.

Alternatively, the driver chip leads 132 can be physically and electrically fixed to the contact pads 122, 151 via compression bonding. In a further alternative, the driver chip 131 can be mounted on the flexible substrate 140 through a socket device (not shown), where the socket device is supported by the flexible substrate 140 and in electrical communication with the contact pads 122 and 151. For example, the driver chip 131 or other control circuit 130 chips can be removably mounted in a control circuit carrier.

Figure 3A:
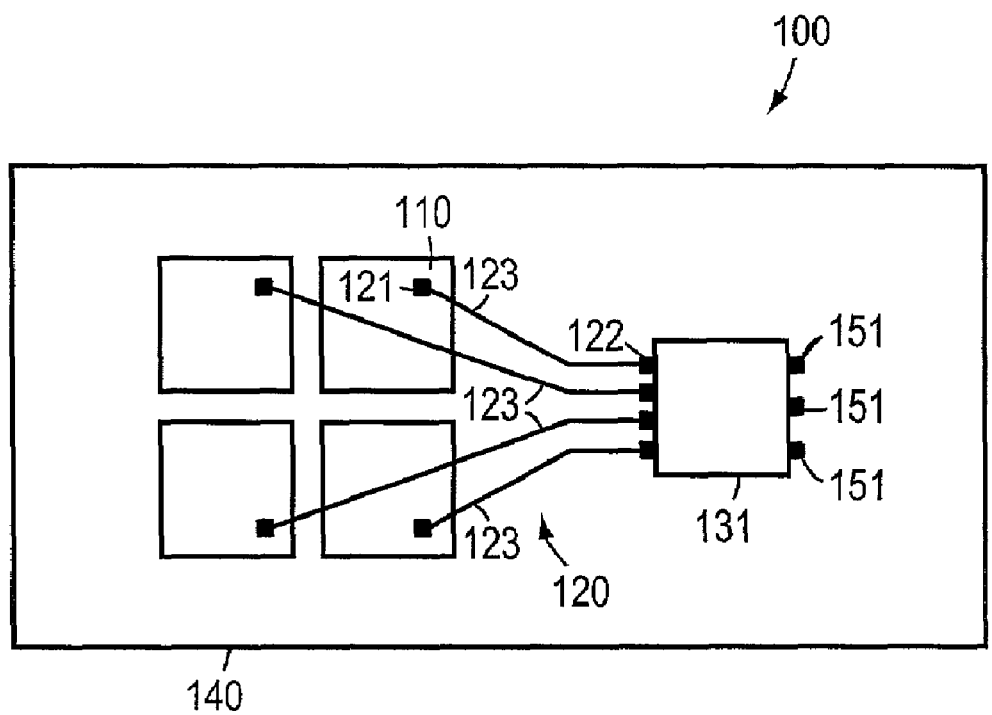
FIG. 3A shows a planar view of an alternative embodiment of the display assembly of FIG. 1.
Figure 3B:
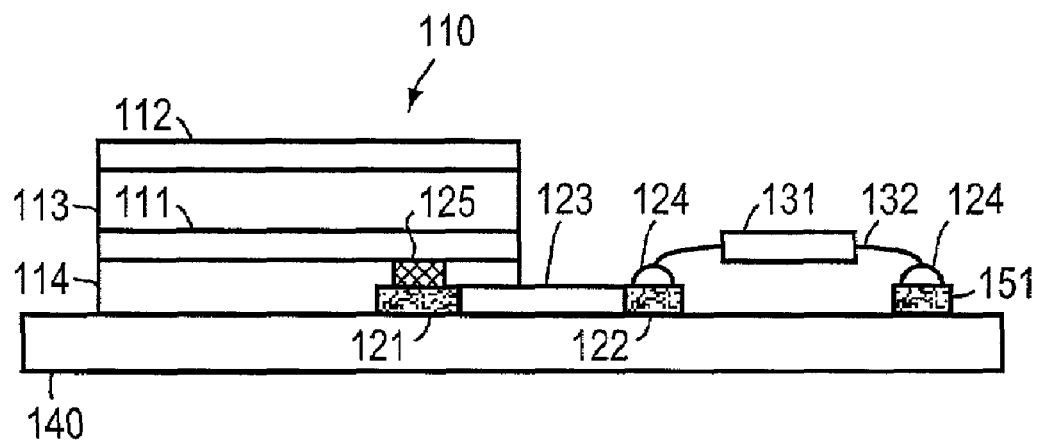
FIG. 3B shows a cross-sectional view that generally corresponds to the display of FIG. 3A.

Referring to FIG. 3A, an alternative embodiment of the electrophoretic display assembly 100 has individual electrical connections 123 that are electrically isolated by an insulating layer (shown only in FIG. 3B) from the pixel electrodes 111. Referring to FIG. 3B, a cross-section view of an embodiment that corresponds to the general principles of the embodiment of FIG. 3A is shown. An insulating layer 114 provides electrical isolation between the electrical connection 123 and the pixel electrode 111. In general, the insulating layer 114 provides electrical isolation between the pixel electrode 111 and the portion of the electrical connections 120 that lie between the pixel electrode 111 and the flexible substrate 140.

In the embodiments of FIGS. 3A and 3B, a conductive via 125 provides electrical communication between the contact pad 121 and the pixel electrode 111. The via 125 provides a conductive pathway through the insulating layer 114. The via 125 and the insulating layer 114 can be formed by a number of processes, for example by printing of dielectric and conductive materials.

In an alternative embodiment of the display assembly 100, the order of deposition of materials 120, 114, 111, 113, 112 on the flexible substrate 140 is inverted. In an example of this embodiment, the flexible substrate 140, such as a 4 mil thick polyester sheet, is deposited, through a printing process, or by vacuum deposition, a transparent conductive coating for the electrode 112. The electrode 112 can comprise a conductive polymer. A microencapsulated electrophoretic display medium 113 is then printed upon the conductive coating, followed by printing of a patterned conducting layer comprising, for example, graphite or silver. The patterned conducting layer comprises the pixel electrode 111. Intermediate to the display medium 113 and the patterned conducting layer, a insulating layer 114 comprised of a printed dielectric can be deposited as well as deposit of vias 125 by printing.

In a further alternative embodiment, the electrode 112 and a microencapsulated electrophoretic display medium 113 are deposited on a second flexible substrate (not shown) followed by lamination of the second flexible substrate to the flexible substrate 140. After the lamination process, the electrophoretic display medium 113 is adjacent to the pixel electrode 111.

In a preferred embodiment, the display medium 113 comprises a microencapsulated electrophoretic medium. Microcapsules have, for example, a diameter in a range of approximately 20 to 500 micrometers. The optical performance of such a medium is substantially unaffected by curvatures with a radius of ten times or less the typical radius of microcapsules in the medium. For example, for microcapsules with a radius of 150 micrometers, the medium can sustain a bend with a radius of 1.5 millimeters or less.

The pixel electrodes 111 address and are in proximity to the electrophoretic display medium 113. The display medium 113 has electrically-responsive optical properties. By selectively altering the optical properties of the display elements 110 using the pixel electrodes 111, images or text can be displayed. As used herein, the term "proximity" refers to a distance through which a voltage may be applied to the display element thereby to alter its optical properties in a localized manner. As noted in embodiments described above, the pixel electrodes 111 are adjacent to the display medium 113 and can be in contact with the display medium 113.

The pixel electrodes 111 can be used to address a variety of different types of display elements 110, including, but not limited to, those with non-light emissive display media, for example, liquid crystals, and bichromal spheres.

Figure 4A:
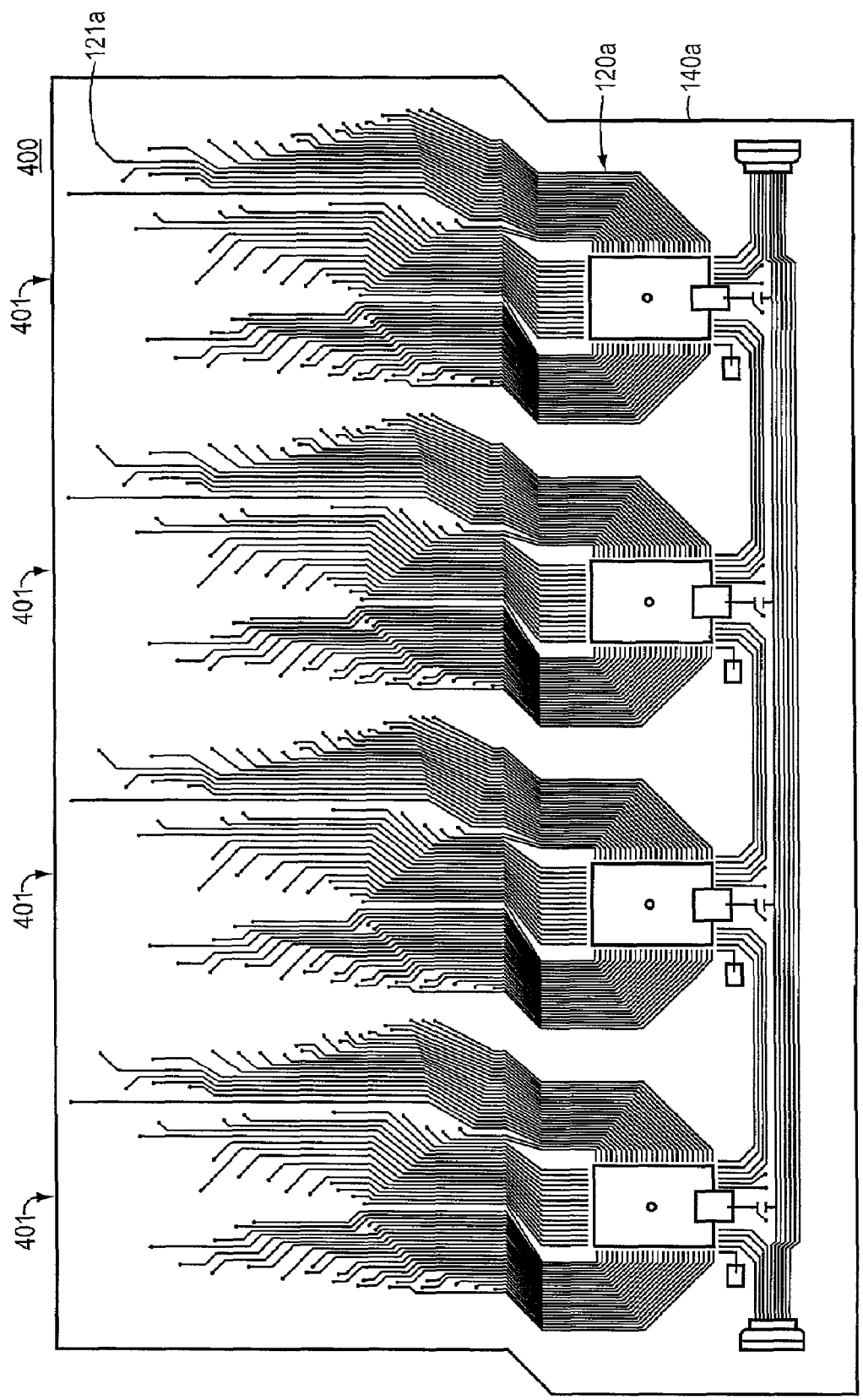
FIG. 4A shows a planar bottom view of an embodiment of a four-character display assembly.
Figure 4B:
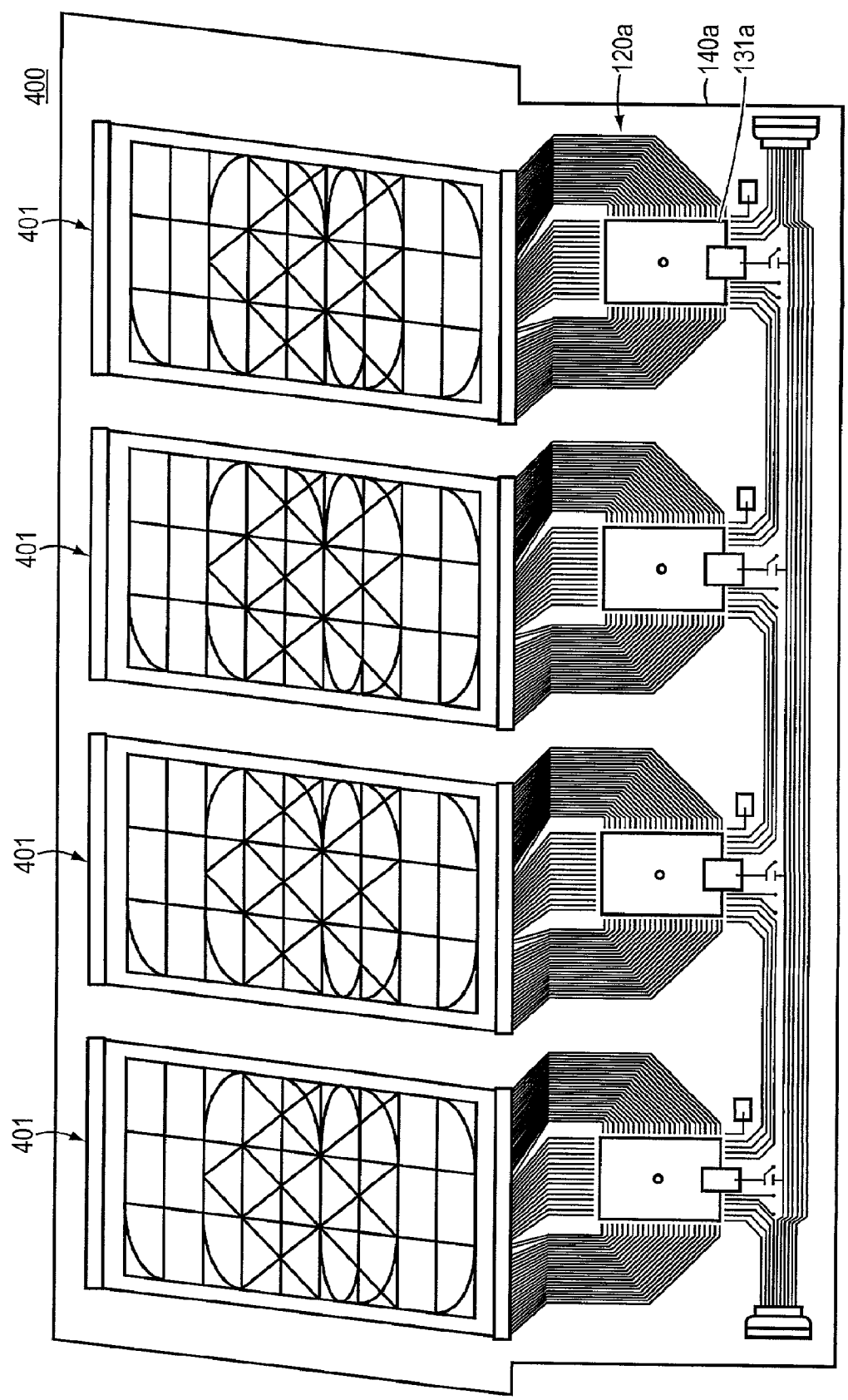
FIG. 4B shows a top view of the four-character display assembly of FIG. 4A.
Figure 4C:
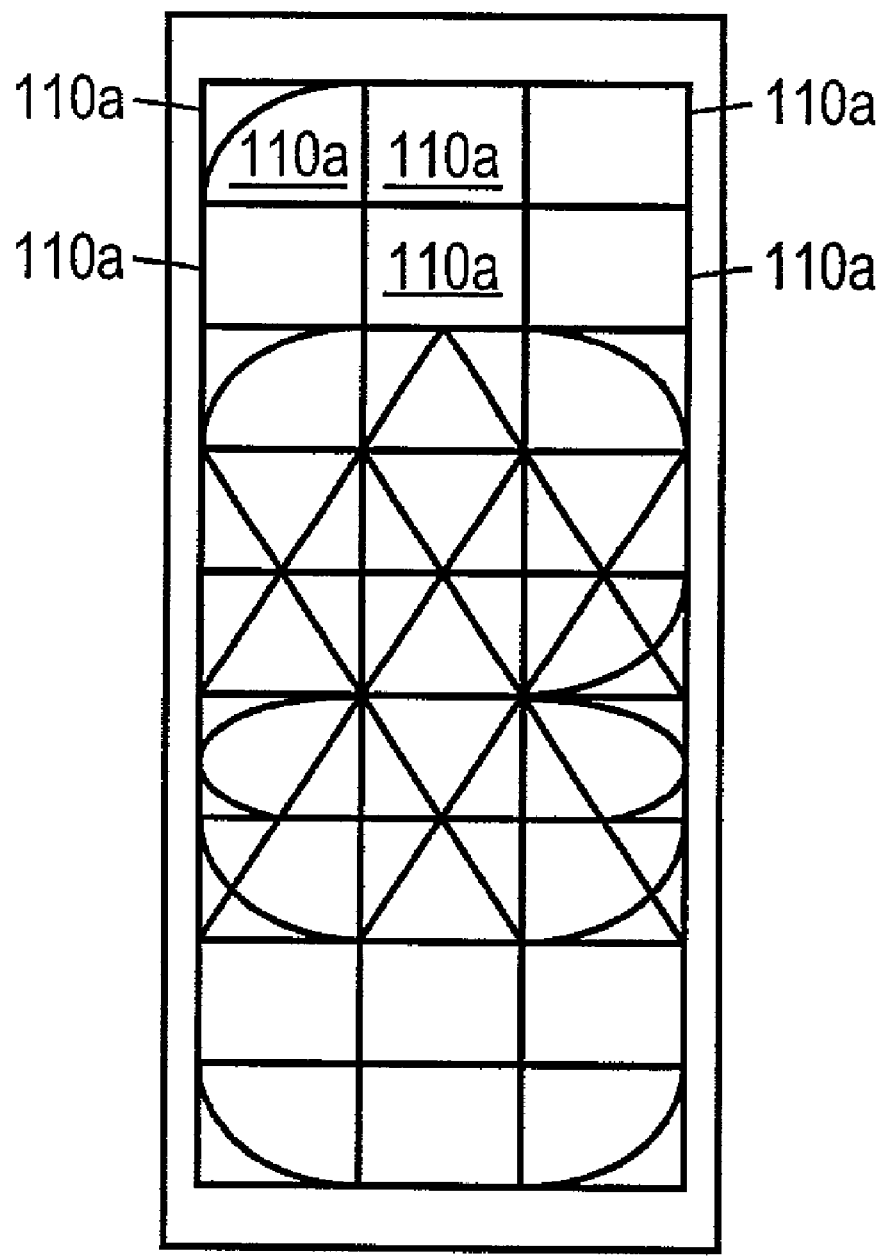
FIG. 4C shows the configuration of display elements of one of the characters of the assembly of FIG. 4B.

Now referring to FIGS. 4A-4C, an embodiment of a four-character display assembly 400 is schematically depicted. FIG. 4A shows a bottom view of the display assembly 400. FIG. 4B shows a top view of the display assembly 400.

The display assembly 400 includes four character display units 401, each capable of displaying, for example, a letter or number. Each display unit 401 includes sixty three display elements 101a. FIG. 4C shows the configuration of the sixty three display elements 110a of one of the characters of the assembly 400, from a top view perspective. This configuration of display elements 101a is well suited for displaying alphanumeric characters.

Drive signal electrical connections 120a electrically connect driver chips 131 a (one for each display unit 401) to the display elements 101a. Hence, each driver chip 131 a is connected by sixty three individual electrical connections to its associated character display unit 401.

The display assembly 400 includes a flexible substrate 140a and other electrical connections 150a to connect the driver chips 131 a to other components. For example, a series of display assemblies 400 can be combined to create a display with more than four characters in a row or more than one row of characters.

II. Method of Manufacturing an Electrophoretic Display Assembly

As discussed above, the various embodiments of the display assembly 100 enable lower cost, higher yield manufacturing processes as well as flexible display devices. Advantages of the invention are illustrated in the following discussion of manufacturing methods.

Figure 5:
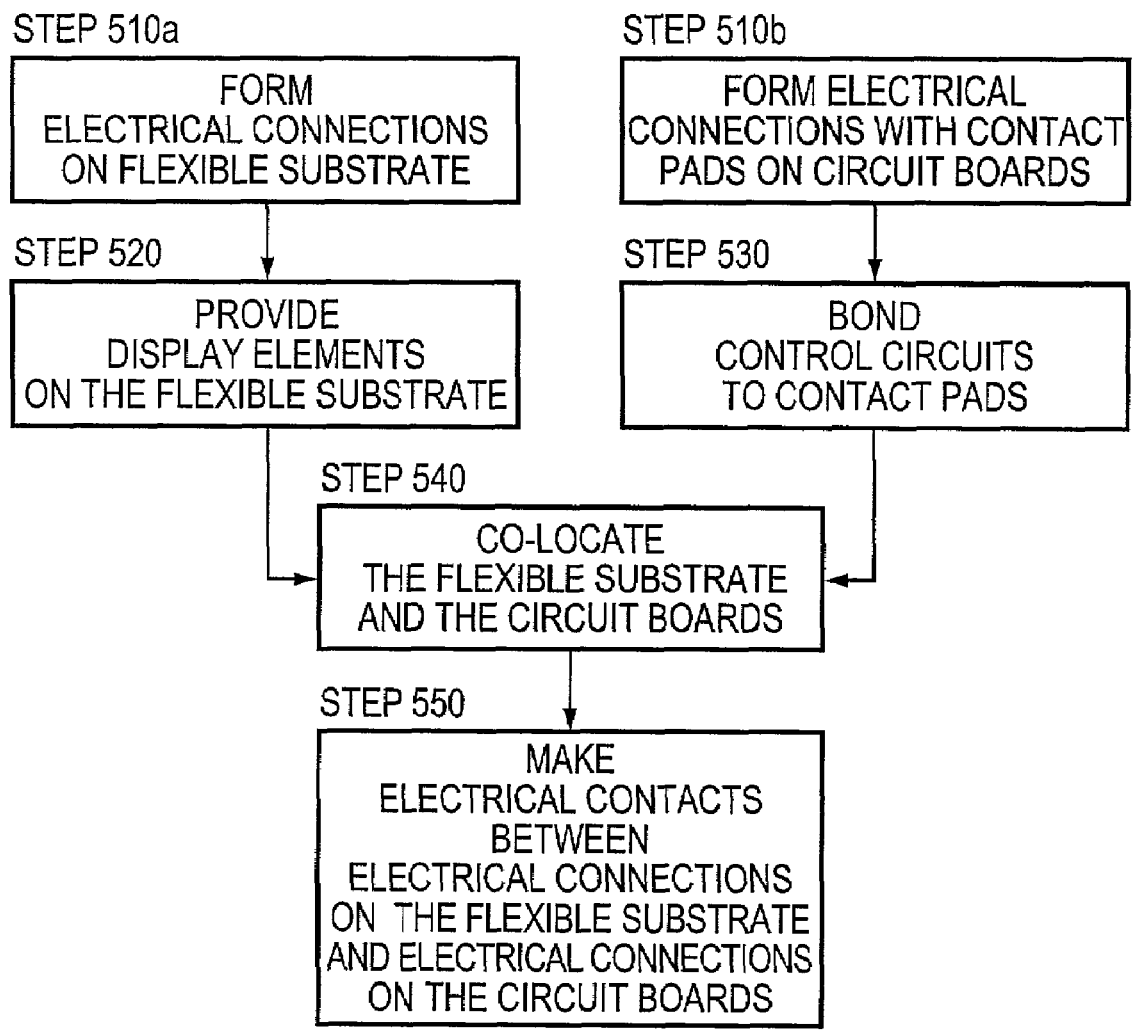
FIG. 5 shows a flow chart of a typical display assembly manufacturing process.

FIG. 5 shows a flowchart of an example of a prior art manufacturing process for a display assembly. Firstly, electrical connections are formed on a flexible substrate (Step 510a). Independently, electrical connections, including contact pads, must be formed on circuit boards (Step 510b). Display elements are then provided on the flexible substrate (Step 520) while, again independently, control circuit leads are bonded to the contact pads on the circuit boards (Step 530). The flexible substrate and the circuit boards must then be physically mounted to each other either directly or indirectly (Step 540) and electrical contact must be made between the electrical connections on the flexible substrate and the electrical connections on the circuit boards (Step 550).

In the prior art approach, an additional row of contact pads are typically formed along one edge of the flexible substrate. This row of contact pads is then used for electrically mating the flexible substrate portion of the display assembly with the circuit boards.

The circuit boards employed in the prior art process are typically heavy, expensive, and rigid. Use of circuit boards thus leads to an inherently less flexible display assembly. Connecting the circuit boards with the substrate leads to cost and yield loss through added manufacturing steps. In particular, the necessity of forming electrical contact between the electrical connections on the various component parts of the display leads to added cost, time in manufacture and yield loss.

In contrast, referring to FIG. 6, an embodiment of a manufacturing process 600 for a display assembly as contemplated by the present invention provides several advantages over the process described above. Firstly, electrical connections, including contact pads, are formed on a flexible substrate (Step 610). Then electrophoretic display elements are provided on the substrate (Step 620). Lastly, control circuits leads are bonded to the contact pads (Step 630). In this embodiment, the lead-contact pad bonding provides both electrical communication and physical support for the control circuits on the substrate.

This embodiment eliminates various disadvantages in prior art manufacturing methods. Electrical connections that serve display elements and control circuits can be formed in a single, cost and yield improving step. Size, weight, and overall flexibility are improved by elimination of rigid circuit boards. In addition to cost savings, this embodiment permits realization of advantages of flexibility offered by use of a flexible substrate. For example, use of a display assembly manufactured in this manner permits fabrication of a flexible display device that can be rolled for storage purposes.

In a preferred embodiment, an encapsulated electrophoretic display assembly is manufactured with use of printing or coating steps on a wide variety of flexible substrates. As used herein, the term "printing" includes all forms of printing and coating, including, but not limited to, pre-metered coatings such as patch die coating, slot or extrusion coating, slide or cascade coating, and curtain coating: roll coating such as knife over roll coating, forward and reverse roll coating, gravure coating, dip coating, spray coating, meniscus coating, spin coating, brush coating, air knife coating, silk screen printing processes, electrostatic printing processes, thermal printing processes, and other similar techniques. Thus, the resulting display can be flexible. Further, because the display medium 113 can be printed (using a variety of methods), the display itself can be made inexpensively.

In a preferred embodiment, a microencapsulated electrophoretic display medium 113 comprising, in part, a flexible binder material, is employed. Such a display medium 113 is amenable to significant flexing. Flexing of the display medium 113 does not affect the optical appearance of the medium. That is, the electrophoretic particles remain in the same position within the microcapsules without regard to the overall orientation or curvature of the binder or display.

Further, printing methods can be used to form the electrical connections and other conductive portions of a display. A rear conductor ("rear" referring to a side of a display that is opposite to that viewed by a user) can be ether opaque or transparent. This allows the use of a variety of printed rear conductors, including graphite inks, silver inks, or conductive polymers.

The front conductor ("front" referring to a side of a display that is viewed by a user) must be transparent, but need not have excellent conductivity. Even materials with relatively poor conductivity, though amenable to printing, can be employed, for example conductive colloidal suspensions and conductive polymers such as are commonly used in anti-static applications.

A microencapsulated electrophoretic medium, unlike a liquid crystal medium, is amendable to use with a wide number of intrinsically conductive polymer systems, including derivatives of polyaniline, polypyrrole, polythiophene, and polyphenylenevinylene.

In short, the present invention permits a more advantageous use of cost savings and mechanical flexibility allowed by use of printing methods for formation of conducting materials in a display assembly.

The following describes in detail various embodiments of materials with applications to the electrophoretic display medium 113.

III. Materials for Use in Electrophoretic Displays

Useful materials for constructing the above-described encapsulated electrophoretic displays are discussed in detail below. Many of these materials will be known to those skilled in the art of constructing conventional electrophoretic displays, or those skilled in the art of microencapsulation. The combination of these materials and processes, along with the other necessary components found in an encapsulated electrophoretic display, comprise the invention described herein.

A. Particles

There is much flexibility in the choice of particles for use in electrophoretic displays, as described above. For purposes of this invention, a particle is any component that is charged or capable of acquiring a charge (i e., has or is capable of acquiring electrophoretic mobility), and, in some cases, this mobility may be zero or close to zero (i.e., the particles will not move). The particles may be neat pigments, dyed (laked) pigments or pigment/polymer composites, or any other component that is charged or capable of acquiring a charge. Typical considerations for the electrophoretic particle are its optical properties, electrical properties, and surface chemistry. The particles may be organic or inorganic compounds, and they may either absorb light or scatter light. The particles for use in the invention may further include scattering pigments, absorbing pigments and luminescent particles. The particles may be retroreflective, such as corner cubes, or they may be electroluminescent, such as zinc sulfide particles, which emit light when excited by an AC field, or they may be photoluminescent. Finally, the particles may be surface treated so as to improve charging or interaction with a charging agent, or to improve dispersibility.

A preferred particle for use in electrophoretic displays of the invention is titania. The titania particles may be coated with a metal oxide, such as aluminum oxide or silicon oxide, for example. The titania particles may have one, two, or more layers of metal-oxide coating. For example, a titania particle for use in electrophoretic displays of the invention may have a coating of aluminum oxide and a coating of silicon oxide. The coatings may be added to the particle in any order.

The electrophoretic particle is usually a pigment, a polymer, a laked pigment, or some combination of the above. A neat pigment can be any pigment, and, usually for a light colored particle, pigments such as, for example, rutile (titania), anatase (titania), barium sulfate, kaolin, or zinc oxide are useful. Some typical particles have high refractive indices, high scattering coefficients, and low absorption coefficients. Other particles are absorptive, such as carbon black or colored pigments used in paints and inks. The pigment should also be insoluble in the suspending fluid. Yellow pigments such as diarylide yellow, hansa yellow, and benzidin yellow have also found use in similar displays. Any other reflective material can be employed for a light colored particle, including non-pigment materials, such as metallic particles.

Useful neat pigments include, but are not limited to, $PbCrO_4$, Cyan blue GT 55-3295 (American Cyanamid Company, Wayne, N.J.), Cibacron Black BG (Ciba Company, Inc., Newport, Del.), Cibacron Turquoise Blue G (Ciba), Cibalon Black BGL (Ciba), Orasol Black BRG (Ciba), Orasol Black RBL (Ciba), Acetamine Blac, CBS (E. I. du Pont de Nemours and Company, Inc., Wilmington, Del.), Crocein Scarlet N Ex (du Pont) (27290), Fiber Black VF (DuPont) (30235), Luxol Fast Black L (DuPont) (Solv. Black 17), Nirosine Base No. 424 (DuPont) (50415 B), Oil Black BG (DuPont) (Solv. Black 16), Rotalin Black RM (DuPont), Sevron Brilliant Red 3 B (DuPont); Basic Black DSC (Dye Specialties, Inc.), Hectolene Black (Dye Specialties, Inc.), Azosol Brilliant Blue B (GAF, Dyestuff and Chemical Division, Wayne, N.J.) (Solv. Blue 9), Azosol Brilliant Green BA (GAF) (Solv. Green 2), Azosol Fast Brilliant Red B (GAF), Azosol Fast Orange RA Conc. (GAF) (Solv. Orange 20), Azosol Fast Yellow GRA Conc. (GAF) (13900 A), Basic Black KMPA (GAF), Benzofix Black CW-CF (GAF) (35435), Cellitazol BNFV Ex Soluble CF (GAF) (Disp. Black 9), Celliton Fast Blue AF Ex Conc (GAF) (Disp. Blue 9), Cyper Black IA (GAF) (Basic Blk. 3), Diamine Black CAP Ex Conc (GAF) (30235), Diamond Black EAN Hi Con. CF (GAF) (15710), Diamond Black PBBA Ex (GAF) (16505); Direct Deep Black EA Ex CF (GAF) (30235), Hansa Yellow G (GAF) (11680); Indanthrene Black BBK Powd. (GAF) (59850), Indocarbon CLGS Conc. CF (GAF) (53295), Katigen Deep Black NND Hi Conc. CF (GAF) (15711), Rapidogen Black 3 G (GAF) (Azoic Blk. 4); Sulphone Cyanine Black BA-CF (GAF) (26370), Zambezi Black VD Ex Conc. (GAF) (30015); Rubanox Red CP-1495 (The Sherwin-Williams Company, Cleveland, Ohio) (15630); Raven 11 (Columbian Carbon Company, Atlanta, Ga.), (carbon black aggregates with a particle size of about 25 µm), Statex B-12 (Columbian Carbon Co.) (a furnace black of 33 µm average particle size), and chrome green.

Particles may also include laked, or dyed, pigments. Laked pigments are particles that have a dye precipitated on them or which are stained. Lakes are metal salts of readily soluble anionic dyes. These are dyes of azo, triphenylmethane or anthraquinone structure containing one or more sulphonic or carboxylic acid groupings. They are usually precipitated by a calcium, barium or aluminum salt onto a substrate. Typical examples are peacock blue lake (Cl Pigment Blue 24) and Persian orange (lake of Cl Acid Orange 7), Black M Toner (GAF) (a mixture of carbon black and black dye precipitated on a lake).

A dark particle of the dyed type may be constructed from any light absorbing material, such as carbon black, or inorganic black materials. The dark material may also be selectively absorbing. For example, a dark green pigment may be used. Black particles may also be formed by staining latices with metal oxides, such latex copolymers consisting of any of butadiene, styrene, isoprene, methacrylic acid, methyl methacrylate, acrylonitrile, vinyl chloride, acrylic acid, sodium styrene sulfonate, vinyl acetate, chlorostyrene, dimethylaminopropylmethacrylamide, isocyanoethyl methacrylate and N-(isobutoxymethacrylamide), and optionally including conjugated diene compounds such as diacrylate, triacrylate, dimethylacrylate and trimethacrylate. Black particles may also be formed by a dispersion polymerization technique.

In the systems containing pigments and polymers, the pigments and polymers may form multiple domains within the electrophoretic particle, or be aggregates of smaller pigment/polymer combined particles. Alternatively, a central pigment core may be surrounded by a polymer shell. The pigment, polymer, or both can contain a dye. The optical purpose of the particle may be to scatter light, absorb light, or both. Useful sizes may range from 1 nm up to about 100 µm, as long as the particles are smaller than the bounding capsule. In a preferred embodiment, the density of the electrophoretic particle may be substantially matched to that of the suspending (i. e., electrophoretic) fluid. As defined herein, a suspending fluid has a density that is "substantially matched" to the density of the particle if the difference in their respective densities is between about zero and about two g/ml. This difference is preferably between about zero and about 0.5 g/ml.

Useful polymers for the particles include, but are not limited to: polystyrene, polyethylene, polypropylene, phenolic resins, Du Pont Elvax resins (ethylene-vinyl acetate copolymers), polyesters, polyacrylates, polymethacrylates, ethylene acrylic acid or methacrylic acid copolymers (Nucrel Resins—DuPont, Primacor Resins—Dow Chemical), acrylic copolymers and terpolymers (Elvacite Resins, DuPont) and PMMA. Useful materials for homopolymer/pigment phase separation in high shear melt include, but are not limited to, polyethylene, polypropylene, polymethylmethacrylate, polyisobutylmethacrylate, polystyrene, polybutadiene, polyisoprene, polyisobutylene, polylauryl methacrylate, polystearyl methacrylate, polyisobornyl methacrylate, poly-t-butyl methacrylate, polyethyl methacrylate, polymethyl acrylate, polyethyl acrylate, polyacrylonitrile, and copolymers of two or more of these materials. Some useful pigment/polymer complexes that are commercially available include, but are not limited to, Process Magenta PM 1776 (Magruder Color Company, Inc., Elizabeth, N.J.), Methyl Violet PMA VM6223 (Magruder Color Company, Inc., Elizabeth, N.J.), and Naphthol FGR RF6257 (Magruder Color Company, Inc., Elizabeth, N.J.).

The pigment-polymer composite may be formed by a physical process, (e.g., attrition or ball milling), a chemical process (e.g., microencapsulation or dispersion polymerization), or any other process known in the art of particle production. From the following non-limiting examples, it may be seen that the processes and materials for both the fabrication of particles and the charging thereof are generally derived from the art of liquid toner, or liquid immersion development. Thus any of the known processes from liquid development are particularly, but not exclusively, relevant.

New and useful electrophoretic particles may still be discovered, but a number of particles already known to those skilled in the art of electrophoretic displays and liquid toners can also prove useful. In general, the polymer requirements for liquid toners and encapsulated electrophoretic inks are similar, in that the pigment or dye must be easily incorporated therein, either by a physical, chemical, or physicochemical process, may aid in the colloidal stability, and may contain charging sites or may be able to incorporate materials which contain charging sites. One general requirement from the liquid toner industry that is not shared by encapsulated electrophoretic inks is that the toner must be capable of "fixing" the image, i.e., heat fusing together to create a uniform film after the deposition of the toner particles.

Typical manufacturing techniques for particles are drawn from the liquid toner and other arts and include ball milling, attrition, jet milling, etc. The process will be illustrated for the case of a pigmented polymeric particle. In such a case the pigment is compounded in the polymer, usually in some kind of high shear mechanism such as a screw extruder. The composite material is then (wet or dry) ground to a starting size of around 10 µm. It is then dispersed in a carrier liquid, for example ISOPAR® (Exxon, Houston, Tex.), optionally with some charge control agent(s), and milled under high shear for several hours down to a final particle size and/or size distribution.

Another manufacturing technique for particles drawn from the liquid toner field is to add the polymer, pigment, and suspending fluid to a media mill. The mill is started and simultaneously heated to temperature at which the polymer swells substantially with the solvent. This temperature is typically near 100° C. In this state, the pigment is easily encapsulated into the swollen polymer. After a suitable time, typically a few hours, the mill is gradually cooled back to ambient temperature while stirring. The milling may be continued for some time to achieve a small enough particle size, typically a few micrometers in diameter. The charging agents may be added at this time. Optionally, more suspending fluid may be added.

Chemical processes such as dispersion polymerization, mini- or micro-emulsion polymerization, suspension polymerization precipitation, phase separation, solvent evaporation, in situ polymerization, seeded emulsion polymerization, or any process which falls under the general category of microencapsulation may be used. A typical process of this type is a phase separation process wherein a dissolved polymeric material is precipitated out of solution onto a dispersed pigment surface through solvent dilution, evaporation, or a thermal change. Other processes include chemical means for staining polymeric latices, for example with metal oxides or dyes.

B. Suspending Fluid

The suspending fluid containing the particles can be chosen based on properties such as density, refractive index, and solubility. A preferred suspending fluid has a low dielectric constant (about 2), high volume resistivity (about $10^{\wedge}15$ ohm-cm), low viscosity (less than 5 cst), low toxicity and environmental impact, low water solubility (less than 10 ppm), high specific gravity (greater than 1.5), a high boiling point (greater than 90° C.), and a low refractive index (less than 1.2).

The choice of suspending fluid may be based on concerns of chemical inertness, density matching to the electrophoretic particle, or chemical compatibility with both the electrophoretic particle and bounding capsule. The viscosity of the fluid should be low when you want the particles to move. The refractive index of the suspending fluid may also be substantially matched to that of the particles. As used herein, the refractive index of a suspending fluid "is substantially matched" to that of a particle if the difference between their respective refractive indices is between about zero and about 0.3, and is preferably between about 0.05 and about 0.2.

Additionally, the fluid may be chosen to be a poor solvent for some polymers, which is advantageous for use in the fabrication of microparticles because it increases the range of polymeric materials useful in fabricating particles of polymers and pigments. Organic solvents, such as halogenated organic solvents, saturated linear or branched hydrocarbons, silicone oils, and low molecular weight halogen-containing polymers are some useful suspending fluids. The suspending fluid may comprise a single fluid. The fluid will, however, often be a blend of more than one fluid in order to tune its chemical and physical properties. Furthermore, the fluid may contain surface modifiers to modify the surface energy or charge of the electrophoretic particle or bounding capsule. Reactants or solvents for the microencapsulation process (oil soluble monomers, for example) can also be contained in the suspending fluid. Charge control agents can also be added to the suspending fluid.

Useful organic solvents include, but are not limited to, epoxides, such as, for example, decane epoxide and dodecane epoxide; vinyl ethers, such as, for example, cyclohexyl vinyl ether and Decave® (International Flavors & Fragrances, Inc., New York, N.Y.); and aromatic hydrocarbons, such as, for example, toluene and naphthalene. Useful halogenated organic solvents include, but are not limited to, tetrafluorodibromoethylene, tetrachloroethylene, trifluorochloroethylene, 1,2,4-trichlorobenzene, carbon tetrachloride. These materials have high densities. Useful hydrocarbons include, but are not limited to, dodecane, tetradecane, the aliphatic hydrocarbons in the Isopar® series (Exxon, Houston, Tex.), Norpar® (series of normal paraffinic liquids), Shell-Sol® (Shell, Houston, Tex.), and Sol-Trol® (Shell), naphtha, and other petroleum solvents. These materials usually have low densities. Useful examples of silicone oils include, but are not limited to, octamethyl cyclosiloxane and higher molecular weight cyclic siloxanes, poly (methyl phenyl siloxane), hexamethyidisiloxane, and polydimethylsiloxane. These materials usually have low densities. Useful low molecular weight halogen-containing polymers include, but are not limited to, poly(chlorotrifluoroethylene) polymer (Halogenated hydrocarbon Inc., River Edge, N.J.), Galden® (a perfluorinated ether from Ausimont, Morristown, N.J.), or Krytox® from DuPont (Wilmington, Del.). In a preferred embodiment, the suspending fluid is a poly(chlorotrifluoroethylene) polymer. In a particularly preferred embodiment, this polymer has a degree of polymerization from about 2 to about 10. Many of the above materials are available in a range of viscosities, densities, and boiling points.

The fluid must be capable of being formed into small droplets prior to a capsule being formed. Processes for forming small droplets include flow-through jets, membranes, nozzles, or orifices, as well as shear-based emulsifying schemes. The formation of small drops may be assisted by electrical or sonic fields. Surfactants and polymers can be used to aid in the stabilization and emulsification of the droplets in the case of an emulsion type encapsulation. A preferred surfactant for use in displays of the invention is sodium dodecylsulfate.

It can be advantageous in some displays for the suspending fluid to contain an optically absorbing dye. This dye must be soluble in the fluid, but will generally be insoluble in the other components of the capsule. There is much flexibility in the choice of dye material. The dye can be a pure compound, or blends of dyes to achieve a particular color, including black. The dyes can be fluorescent, which would produce a display in which the fluorescence properties depend on the position of the particles. The dyes can be photoactive, changing to another color or becoming colorless upon irradiation with either visible or ultraviolet light, providing another means for obtaining an optical response. Dyes could also be polymerizable, forming a solid absorbing polymer inside the bounding shell.

There are many dyes that can be chosen for use in encapsulated electrophoretic display. Properties important here include light fastness, solubility in the suspending liquid, color, and cost. These are generally from the class of azo, anthraquinone, and triphenylmethane type dyes and may be chemically modified so as to increase the solubility in the oil phase and reduce the adsorption by the particle surface.

A number of dyes already known to those skilled in the art of electrophoretic displays will prove useful. Useful azo dyes include, but are not limited to: the Oil Red dyes, and the Sudan Red and Sudan Black series of dyes. Useful anthraquinone dyes include, but are not limited to: the Oil Blue dyes, and the Macrolex Blue series of dyes. Useful triphenylmethane dyes include, but are not limited to, Michler's hydrol, Malachite Green, Crystal Violet, and Auramine O.

C. Charge Control Agents and Particle Stabilizers

Charge control agents are used to provide good electrophoretic mobility to the electrophoretic particles. Stabilizers are used to prevent agglomeration of the electrophoretic particles, as well as prevent the electrophoretic particles from irreversibly depositing onto the capsule wall. Either component can be constructed from materials across a wide range of molecular weights (low molecular weight, oligomeric, or polymeric), and may be pure or a mixture. In particular, suitable charge control agents are generally adapted from the liquid toner art. The charge control agent used to modify and/or stabilize the particle surface charge is applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

An optional charge control agent or charge director may be used. These constituents typically consist of low molecular weight surfactants, polymeric agents, or blends of one or more components and serve to stabilize or otherwise modify the sign and/or magnitude of the charge on the electrophoretic particles. The charging properties of the pigment itself may be accounted for by taking into account the acidic or basic surface properties of the pigment, or the charging sites may take place on the carrier resin surface (if present), or a combination of the two. Additional pigment properties which may be relevant are the particle size distribution, the chemical composition, and the lightfastness. The charge control agent used to modify and/or stabilize the particle surface charge is applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

Charge adjuvants may also be added. These materials increase the effectiveness of the charge control agents or charge directors. The charge adjuvant may be a polyhydroxy compound or an aminoalcohol compound, which are preferably soluble in the suspending fluid in an amount of at least 2% by weight. Examples of polyhydroxy compounds which contain at least two hydroxyl groups include, but are not limited to, ethylene glycol, 2,4,7,9-tetramethyl-decyne-4,7-diol, poly(propylene glycol), pentaethylene glycol, tripropylene glycol, triethylene glycol, glycerol, pentaerythritol, glycerol tris(12-hydroxystearate), propylene glycol monohydroxystearate, and ethylene glycol monohydroxystearate. Examples of aminoalcohol compounds which contain at least one alcohol function and one amine function in the same molecule include, but are not limited to, triisopropanolamine, triethanolamine, ethanolamine, 3-amino-1-propanol, o-aminophenol, 5-amino-1-pentanol, and tetrakis(2-hydroxyethyl)ethylene-diamine. The charge adjuvant is preferably present in the suspending fluid in an amount of about 1 to about 100 mg/g of the particle mass, and more preferably about 50 to about 200 mg/g.

The surface of the particle may also be chemically modified to aid dispersion, to improve surface charge, and to improve the stability of the dispersion, for example. Surface modifiers include organic siloxanes, organohalogen silanes and other functional silane coupling agents (Dow Corning® Z-6070, Z-6124, and 3 additive, Midland, Mich.); organic titanates and zirconates (Tyzor® TOT, TBT, and TE Series, DuPont, Wilmington, Del.); hydrophobing agents, such as long chain ($C_{12}$ to $C_{50}$) alkyl and alkyl benzene sulphonic acids, fatty amines or diamines and their salts or quaternary derivatives; and amphipathic polymers which can be covalently bonded to the particle surface.

In general, it is believed that charging results as an acid-base reaction between some moiety present in the continuous phase and the particle surface. Thus useful materials are those which are capable of participating in such a reaction, or any other charging reaction as known in the art.

Different non-limiting classes of charge control agents which are useful include organic sulfates or sulfonates, metal soaps, block or comb copolymers, organic amides, organic zwitterions, and organic phosphates and phosphonates. Useful organic sulfates and sulfonates include, but are not limited to, sodium bis(2-ethyl hexyl) sulfosuccinate, calcium dodecyl benzene sulfonate, calcium petroleum sulfonate, neutral or basic barium dinonyinaphthalene sulfonate, neutral or basic calcium dinonyinaphthalene sulfonate, dodecylbenzenesulfonic acid sodium salt, and ammonium lauryl sulfate. Useful metal soaps include, but are not limited to, basic or neutral barium petronate, calcium petronate, Co—, Ca—, Cu—, Mn—, Ni—, Zn—, and Fe— salts of naphthenic acid, Ba—, Al—, Zn—, Cu—, Pb—, and Fe— salts of stearic acid, divalent and trivalent metal carboxylates, such as aluminum tristearate, aluminum octanoate, lithium heptanoate, iron stearate, iron distearate, barium stearate, chromium stearate, magnesium octanoate, calcium stearate, iron naphthenate, and zinc naphthenate, Mn— and Zn— heptanoate, and Ba—, Al—, Co—, Mn—, and Zn— octanoate. Useful block or comb copolymers include, but are not limited to, AB diblock copolymers of (A) polymers of 2-(N,N)-dimethylaminoethyl methacrylate quaternized with methyl-p-toluenesulfonate and (B) poly(2-ethylhexyl methacrylate), and comb graft copolymers with oil soluble tails of poly(12-hydroxystearic acid) and having a molecular weight of about 1800, pendant on an oil-soluble anchor group of poly (methyl methacrylate-methacrylic acid). Useful organic amides include, but are not limited to, polyisobutylene succinimides such as OLOA 1200 or 3700, and N-vinyl pyrrolidone polymers. Useful organic zwitterions include, but are not limited to, lecithin. Useful organic phosphates and phosphonates include, but are not limited to, the sodium salts of phosphated mono- and di-glycerides with saturated and unsaturated acid substituents.

Particle dispersion stabilizers may be added to prevent particle flocculation or attachment to the capsule walls. For the typical high resistivity liquids used as suspending fluids in electrophoretic displays, nonaqueous surfactants may be used. These include, but are not limited to, glycol ethers, acetylenic glycols, alkanolamides, sorbitol derivatives, alkyl amines, quaternary amines, imidazolines, dialkyl oxides, and sulfosuccinates.

D. Encapsulation

There is a long and rich history to encapsulation, with numerous processes and polymers having proven useful in creating capsules. Encapsulation of the internal phase may be accomplished in a number of different ways. Numerous suitable procedures for microencapsulation are detailed in both Microencapsulation, Processes and Applications, (I. E. Vandegaer, ed.), Plenum Press, New York, N.Y. (1974) and Gutcho, Microcapsules and Microencapsulation Techniques, Nuyes Data Corp., Park Ridge, N.J. (1976). The processes fall into several general categories, all of which can be applied to the present invention: interfacial polymerization, in situ polymerization, physical processes, such as coextrusion and other phase separation processes, in-liquid curing, and simple/complex coacervation.

Numerous materials and processes should prove useful in formulating displays of the present invention. Useful materials for simple coacervation processes include, but are not limited to, gelatin, polyvinyl alcohol, polyvinyl acetate, and cellulosic derivatives, such as, for example, carboxymethylcellulose. Useful materials for complex coacervation processes include, but are not limited to, gelatin, acacia, caragreenan, carboxymethylcellulose, hydrolyzed styrene anhydride copolymers, agar, alginate, casein, albumin, methyl vinyl ether co-maleic anhydride, and cellulose phthalate. Useful materials for phase separation processes include, but are not limited to, polystyrene, PMMA, poly(ethyl methacrylate), poly(butyl methacrylate), ethyl cellulose, poly(vinyl pyridine), and polyacrylonitrile. Useful materials for in situ polymerization processes include, but are not limited to, polyhydroxyamides, with aldehydes, melamine, or urea and formaldehyde; water-soluble oligomers of the condensate of melamine, or urea and formaldehyde; and vinyl monomers, such as, for example, styrene, MMA and acrylonitrile. Finally, useful materials for interfacial polymerization processes include, but are not limited to, diacyl chlorides, such as, for example, sebacoyl, adipoyl, and di- or poly-amines or alcohols, and isocyanates. Useful emulsion polymerization materials may include, but are not limited to, styrene, vinyl acetate, acrylic acid, butyl acrylate, t-butyl acrylate, methyl methacrylate, and butyl methacrylate.

Capsules produced may be dispersed into a curable carrier, resulting in an ink which may be printed or coated on large and arbitrarily shaped or curved surfaces using conventional printing and coating techniques.

In the context of the present invention, one skilled in the art will select an encapsulation procedure and wall material based on the desired capsule properties. These properties include the distribution of capsule radii; electrical, mechanical, diffusion, and optical properties of the capsule wall; and chemical compatibility with the internal phase of the capsule.

The capsule wall generally has a high electrical resistivity. Although it is possible to use walls with relatively low resistivities, this may limit performance in requiring relatively higher addressing voltages. The capsule wall should also be mechanically strong (although if the finished capsule powder is to be dispersed in a curable polymeric binder for coating, mechanical strength is not as critical). The capsule wall should generally not be porous. If, however, it is desired to use an encapsulation procedure that produces porous capsules, these can be overcoated in a post-processing step (i.e., a second encapsulation). Moreover, if the capsules are to be dispersed in a curable binder, the binder will serve to close the pores. The capsule walls should be optically clear. The wall material may, however, be chosen to match the refractive index of the internal phase of the capsule (i.e., the suspending fluid) or a binder in which the capsules are to be dispersed. For some applications (e.g., interposition between two fixed electrodes), monodispersed capsule radii are desirable.

An encapsulation procedure involves a polymerization between urea and formaldehyde in an aqueous phase of an oil/water emulsion in the presence of a negatively charged, carboxyl-substituted, linear hydrocarbon polyelectrolyte material. The resulting capsule wall is a urea/formaldehyde copolymer, which discretely encloses the internal phase. The capsule is clear, mechanically strong, and has good resistivity properties.

The related technique of in situ polymerization utilizes an oil/water emulsion, which is formed by dispersing the electrophoretic composition (i.e., the dielectric liquid containing a suspension of the pigment particles) in an aqueous environment. The monomers polymerize to form a polymer with higher affinity for the internal phase than for the aqueous phase, thus condensing around the emulsified oily droplets. In one especially useful in situ polymerization processes, urea and formaldehyde condense in the presence of poly (acrylic acid) (See, e.g., U.S. Pat. No. 4,001,140). In other useful process, any of a variety of cross-linking agents borne in aqueous solution is deposited around microscopic oil droplets. Such cross-linking agents include aldehydes, especially formaldehyde, glyoxal, or glutaraldehyde; alum; zirconium salts; and poly isocyanates. The entire disclosures of the U.S. Pat. Nos. 4,001,140 and 4,273,672 patents are hereby incorporated by reference herein.

The coacervation approach also utilizes an oil/water emulsion. One or more colloids are coacervated (i.e., agglomerated) out of the aqueous phase and deposited as shells around the oily droplets through control of temperature, pH and/or relative concentrations, thereby creating the microcapsule. Materials suitable for coacervation include gelatins and gum arabic.

The interfacial polymerization approach relies on the presence of an oil-soluble monomer in the electrophoretic composition, which once again is present as an emulsion in an aqueous phase. The monomers in the minute hydrophobic droplets react with a monomer introduced into the aqueous phase, polymerizing at the interface between the droplets and the surrounding aqueous medium and forming shells around the droplets. Although the resulting walls are relatively thin and may be permeable, this process does not require the elevated temperatures characteristic of some other processes, and therefore affords greater flexibility in terms of choosing the dielectric liquid.

Coating aids can be used to improve the uniformity and quality of the coated or printed electrophoretic ink material. Wetting agents are typically added to adjust the interfacial tension at the coating/substrate interface and to adjust the liquid/air surface tension. Wetting agents include, but are not limited to, anionic and cationic surfactants, and nonionic species, such as silicone or fluoropolymer based materials. Dispersing agents may be used to modify the interfacial tension between the capsules and binder, providing control over flocculation and particle settling.

Surface tension modifiers can be added to adjust the air/ink interfacial tension. Polysiloxanes are typically used in such an application to improve surface leveling while minimizing other defects within the coating. Surface tension modifiers include, but are not limited to, fluorinated surfactants, such as, for example, the Zonyl® series from DuPont (Wilmington, Del.), the Fluorod® series from 3M (St. Paul, Minn.), and the fluoroalkyl series from Autochem (Glen Rock, N.J.); siloxanes, such as, for example, Silwet® from Union Carbide (Danbury, Conn.); and polyethoxy and polypropoxy alcohols. Antifoams, such as silicone and silicone-free polymeric materials, may be added to enhance the movement of air from within the ink to the surface and to facilitate the rupture of bubbles at the coating surface. Other useful antifoams include, but are not limited to, glyceryl esters, polyhydric alcohols, compounded antifoams, such as oil solutions of alkyl benzenes, natural fats, fatty acids, and metallic soaps, and silicone antifoaming agents made from the combination of dimethyl siloxane polymers and silica. Stabilizers such as uv-absorbers and antioxidants may also be added to improve the lifetime of the ink.

Other additives to control properties like coating viscosity and foaming can also be used in the coating fluid. Stabilizers (UV-absorbers, antioxidants) and other additives which could prove useful in practical materials.

E. Binder Material

The binder is used as a non-conducting, adhesive medium supporting and protecting the capsules, as well as binding the electrode materials to the capsule dispersion. Binders are available in many forms and chemical types. Among these are water-soluble polymers, water-borne polymers, oil-soluble polymers, thermoset and thermoplastic polymers, and radiation-cured polymers.

Among the water-soluble polymers are the various polysaccharides, the polyvinyl alcohols, N-methylpyrrolidone, N-vinylpyrrolidone, the various Carbowax® species (Union Carbide, Danbury, Conn.), and poly(2-hydroxyethyl acrylate).

The water-dispersed or water-borne systems are generally latex compositions, typified by the Neorez® and Neocryl® resins (Zeneca Resins, Wilmington, Mass.), Acrysol® (Rohm and Haas, Philadelphia, Pa.), Bayhydrol® (Bayer, Pittsburgh, Pa.), and the Cytec Industries (West Paterson, N.J.) HP line. These are generally latices of polyurethanes, occasionally compounded with one or more of the acrylics, polyesters, polycarbonates or silicones, each lending the final cured resin in a specific set of properties defined by glass transition temperature, degree of "tack," softness, clarity, flexibility, water permeability and solvent resistance, elongation modulus and tensile strength, thermoplastic flow, and solids level. Some water-borne systems can be mixed with reactive monomers and catalyzed to form more complex resins. Some can be further cross-linked by the use of a crosslinking reagent, such as an aziridine, for example, which reacts with carboxyl groups.

A typical application of a water-borne resin and aqueous capsules follows. A volume of particles is centrifuged at low speed to separate excess water. After a given centrifugation process, for example 10 minutes at 60×g, the capsules are found at the bottom of the centrifuge tube, while the water portion is at the top. The water portion is carefully removed (by decanting or pipetting). The mass of the remaining capsules is measured, and a mass of resin is added such that the mass of resin is between one eighth and one tenth of the weight of the capsules. This mixture is gently mixed on an oscillating mixer for approximately one half hour. After about one half hour, the mixture is ready to be coated onto the appropriate substrate.

The thermoset systems are exemplified by the family of epoxies. These binary systems can vary greatly in viscosity, and the reactivity of the pair determines the "pot life" of the mixture. If the pot life is long enough to allow a coating operation, capsules may be coated in an ordered arrangement in a coating process prior to the resin curing and hardening.

Thermoplastic polymers, which are often polyesters, are molten at high temperatures. A typical application of this type of product is hot-melt glue. A dispersion of heat-resistant capsules could be coated in such a medium. The solidification process begins during cooling, and the final hardness, clarity and flexibility are affected by the branching and molecular weight of the polymer.

Oil or solvent-soluble polymers are often similar in composition to the water-borne system, with the obvious exception of the water itself. The latitude in formulation for solvent systems is enormous, limited only by solvent choices and polymer solubility. Of considerable concern in solvent-based systems is the viability of the capsule itself—the integrity of the capsule wall cannot be compromised in any way by the solvent.

Radiation cure resins are generally found among the solvent-based systems. Capsules may be dispersed in such a medium and coated, and the resin may then be cured by a timed exposure to a threshold level of ultraviolet radiation, either long or short wavelength. As in all cases of curing polymer resins, final properties are determined by the branching and molecular weights of the monomers, oligomers and crosslinkers.

A number of "water-reducible" monomers and oligomers are, however, marketed. In the strictest sense, they are not water soluble, but water is an acceptable diluent at low concentrations and can be dispersed relatively easily in the mixture. Under these circumstances, water is used to reduce the viscosity (initially from thousands to hundreds of thousands centipoise). Water-based capsules, such as those made from a protein or polysaccharide material, for example, could be dispersed in such a medium and coated, provided the viscosity could be sufficiently lowered. Curing in such systems is generally by ultraviolet radiation.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A method of manufacturing an electrophoretic display assembly, comprising the steps of:
   providing a flexible substrate;
   forming upon said substrate an electrical connection having a first contact pad and a second contact pad spaced from one another;
   mounting upon said substrate a control circuit in electrical communication with said second contact pad, said control circuit not being in electrical communication with said first contact pad except via said electrical connection; and
   providing an electrophoretic display element in electrical communication with said first contact pad, said electrophoretic display element not being in electrical communication with said second contact pad except via said electrical connection.

2. The method of claim 1, wherein the step of forming upon said substrate an electrical connection comprises a printing process.

3. The method of claim 1, wherein the step of providing an electrophoretic display element comprises a printing process.

4. The method of claim 1, wherein said control circuit is connected to said second contact pad with a curable, electrically conductive resin.

5. The method of claim 1, wherein said control circuit is connected to said second contact pad with an electrically conductive ink.

6. The method of claim 1, wherein said control circuit is connected to said second contact pad with an electrically conductive paint.

7. The method of claim 1, wherein said control circuit is connected to said second contact pad by being removably mounted in a control circuit carrier that is in electrical communication with said second contact pad.

8. The method of claim 1, wherein said control circuit comprises an electrophoretic display driver chip.

9. The method of claim 1 further comprising forming upon said substrate a third contact pad spaced from said first and second contact pads, said control circuit being in electrical communication with said third contact pad.

10. The method of claim 1 wherein a plurality of electrophoretic display elements are provided, each electrophoretic display element having an associated electrical connection and first and second contact pads, and said control circuit is in electrical communication with the plurality of second contact pads.

11. A method of manufacturing an electrophoretic display assembly, comprising the steps of:
providing a first flexible substrate;
forming upon said first flexible substrate an electrical connection having a first contact pad and a second contact pad separated from each other;
mounting on said first flexible substrate a control circuit in electrical communication with said second contact pad but not in electrical communication with said first contact pad except via said electrical connection;
providing a second flexible substrate;
disposing upon said second flexible substrate an electrophoretic display element; and
disposing said first flexible substrate adjacent said second flexible substrate so that said first contact pad addresses said electrophoretic display element.

12. The method of claim 11, wherein said control circuit is connected to said second contact pad with a curable, electrically conductive resin.

13. The method of claim 11, wherein said control circuit is connected to said second contact pad with an electrically conductive ink.

14. The method of claim 11, wherein said control circuit is connected to said second contact pad with an electrically conductive paint.

15. The method of claim 11, wherein said control circuit is connected to said second contact pad by being removably mounted in a control circuit carrier that is in electrical communication with said second contact pad.

16. The method of claim 11, wherein said control circuit comprises an electrophoretic display driver chip.

17. The method of claim 11 wherein the step of disposing upon said second flexible substrate an electrophoretic display element comprises a printing process.

18. The method of claim 11, wherein the step of disposing said first flexible substrate adjacent said second flexible substrate further comprises a laminating process.

* * * * *